(12) United States Patent
Hayashi et al.

(10) Patent No.: US 9,312,404 B2
(45) Date of Patent: Apr. 12, 2016

(54) COMPOSITION FOR MANUFACTURING ELECTRODE OF SOLAR CELL, METHOD OF MANUFACTURING SAME ELECTRODE, AND SOLAR CELL USING ELECTRODE OBTAINED BY SAME METHOD

(71) Applicant: MITSUBISHI MATERIALS CORPORATION, Tokyo (JP)

(72) Inventors: Toshiharu Hayashi, Naka-gun (JP); Yoshiaki Takata, Iwaki (JP); Kazuhiko Yamasaki, Naka-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 84 days.

(21) Appl. No.: 14/244,575

(22) Filed: Apr. 3, 2014

(65) Prior Publication Data

US 2014/0224304 A1    Aug. 14, 2014

Related U.S. Application Data

(62) Division of application No. 12/306,884, filed as application No. PCT/JP2007/055649 on Mar. 20, 2007, now Pat. No. 8,816,193.

(30) Foreign Application Priority Data

| Jun. 30, 2006 | (JP) | 2006-181818 |
| Oct. 11, 2006 | (JP) | 2006-277230 |
| Oct. 24, 2006 | (JP) | 2006-288528 |
| Oct. 24, 2006 | (JP) | 2006-288529 |
| Oct. 24, 2006 | (JP) | 2006-288530 |
| Nov. 10, 2006 | (JP) | 2006-305409 |
| Nov. 10, 2006 | (JP) | 2006-305508 |
| Nov. 14, 2006 | (JP) | 2006-307307 |

(51) Int. Cl.
*H01L 31/0224* (2006.01)
*H01L 31/18* (2006.01)
*H01L 31/04* (2014.01)
*H05K 1/09* (2006.01)

(52) U.S. Cl.
CPC ........ *H01L 31/022425* (2013.01); *H01L 31/18* (2013.01); *H01L 31/1884* (2013.01); *H01L 31/04* (2013.01); *H05K 1/097* (2013.01); *Y02E 10/50* (2013.01)

(58) Field of Classification Search
CPC ............ H01L 31/022425; H01L 31/04; H01L 31/1884
USPC ...................................................... 136/256
See application file for complete search history.

(56) References Cited

U.S. PATENT DOCUMENTS

| 4,954,476 A | 9/1990 | Hums |
| 5,136,351 A | 8/1992 | Inoue et al. |
| 5,282,902 A | 2/1994 | Matsuyama et al. |
| 5,378,408 A | 1/1995 | Carroll et al. |
| 5,957,828 A | 9/1999 | Hayashi et al. |
| 6,071,437 A | 6/2000 | Oya et al. |
| 6,086,790 A | 7/2000 | Hayashi et al. |
| 6,117,366 A | 9/2000 | Park et al. |
| 6,136,228 A | 10/2000 | Hirai et al. |
| 6,366,333 B1 | 4/2002 | Yamamoto et al. |
| 6,451,433 B1 | 9/2002 | Oka et al. |
| 7,940,447 B2 | 5/2011 | Wu et al. |
| 2004/0046154 A1 | 3/2004 | McVicker et al. |
| 2004/0259007 A1 | 12/2004 | Takahashi et al. |
| 2005/0116203 A1 | 6/2005 | Takahashi et al. |
| 2006/0073667 A1 | 4/2006 | Li et al. |
| 2006/0083694 A1 | 4/2006 | Kodas et al. |
| 2006/0189113 A1 | 8/2006 | Vanheusden et al. |
| 2006/0231801 A1 | 10/2006 | Carroll et al. |
| 2008/0063874 A1 | 3/2008 | Rakow et al. |
| 2008/0134936 A1 | 6/2008 | Kamikoriyama et al. |
| 2009/0053469 A1 | 2/2009 | Sato et al. |
| 2009/0250106 A1 | 10/2009 | Hayashi et al. |
| 2010/0096002 A1 | 4/2010 | Hayashi et al. |
| 2013/0099179 A1 | 4/2013 | Vanheusden et al. |

FOREIGN PATENT DOCUMENTS

| EP | 1775734 A2 | 4/2007 |
| JP | 63-213974 A | 9/1988 |
| JP | 64-054768 A | 3/1989 |
| JP | 02-007476 A | 1/1990 |
| JP | 03-099477 A | 4/1991 |
| JP | 03-099478 A | 4/1991 |
| JP | 04-218977 A | 8/1992 |
| JP | 04-334069 A | 11/1992 |

(Continued)

OTHER PUBLICATIONS

Office Action mailed Nov. 13, 2014 for the related German Application No. 11 2007 001 507.1.
Office Action mailed Aug. 13, 2013 for the related Japanese Patent Application No. 2012-229394.
Office Action mailed Sep. 17, 2013 for the related Japanese Patent Application No. 2012-083491.
Office Action mailed Oct. 8, 2013 for the related Japanese Patent Application No. 2012160131.
Notice of Allowance mailed Nov. 12, 2013 for the related Japanese Patent Application No. 2012-083491.

(Continued)

*Primary Examiner* — Golam Mowla
(74) *Attorney, Agent, or Firm* — Leason Ellis LLP.

(57) ABSTRACT

A composition for manufacturing an electrode of a solar cell, comprising metal nanoparticles dispersed in a dispersive medium, wherein the metal nanoparticles contain silver nanoparticles of 75 weight % or more, the metal nanoparticles are chemically modified by a protective agent having a main chain of organic molecule comprising a carbon backbone of carbon number of 1 to 3, and the metal nanoparticles contains 70% or more in number-average of metal nanoparticles having a primary grain size within a range of 10 to 50 nm.

4 Claims, No Drawings

(56) References Cited

FOREIGN PATENT DOCUMENTS

| | | | |
|---|---|---|---|
| JP | 05-095127 A | 4/1993 | |
| JP | 06-196728 A | 7/1994 | |
| JP | 06-300907 A | 10/1994 | |
| JP | 07-106617 A | 4/1995 | |
| JP | 07-330337 A | 12/1995 | |
| JP | 09-115438 A | 5/1997 | |
| JP | 09-246577 A | 9/1997 | |
| JP | 10-001777 A | 1/1998 | |
| JP | 10-073704 A | 3/1998 | |
| JP | 10066861 | 3/1998 | |
| JP | 10-188681 A | 7/1998 | |
| JP | 10326522 | 12/1998 | |
| JP | 11-045619 | 2/1999 | |
| JP | 11329070 | 11/1999 | |
| JP | 2000090737 | 3/2000 | |
| JP | 2000-239853 A | 9/2000 | |
| JP | 2001313400 | 11/2001 | |
| JP | 2001325831 | 11/2001 | |
| JP | 2002-025942 A | 1/2002 | |
| JP | 3287754 | 3/2002 | |
| JP | 2002-198547 A | 7/2002 | |
| JP | 2002-237214 A | 8/2002 | |
| JP | 2003-132734 A | 5/2003 | |
| JP | 2003-179241 A | 6/2003 | |
| JP | 2003-273041 A | 9/2003 | |
| JP | 2004-006263 A | 1/2004 | |
| JP | 2004-143325 | 5/2004 | |
| JP | 2004-143571 A | 5/2004 | |
| JP | 2004-182487 A | 7/2004 | |
| JP | 2004-182812 A | 7/2004 | |
| JP | 2004-296801 A | 10/2004 | |
| JP | 2005-002387 A | 1/2005 | |
| JP | 2005-015647 A | 1/2005 | |
| JP | 2005504409 | 2/2005 | |
| JP | 2005-191107 A | 7/2005 | |
| JP | 2005-243500 A | 9/2005 | |
| JP | 2005-268547 A | 9/2005 | |
| JP | 2005243500 | 9/2005 | |
| JP | 2005-353904 A | 12/2005 | |
| JP | 2006-193594 A | 7/2006 | |
| JP | 2006-210301 A | 8/2006 | |
| TW | 1229108 | 3/2005 | |
| TW | 200510493 | 3/2005 | |
| TW | 200622454 A | 7/2006 | |
| WO | WO-03025954 | 3/2003 | |
| WO | WO-03085052 | 10/2003 | |
| WO | WO-2006/061557 A | 6/2006 | |
| WO | WO-2006/070747 A | 7/2006 | |
| WO | WO-2006/076611 A | 7/2006 | |
| WO | WO-2006/109799 A | 10/2006 | |
| WO | WO-2007/080997 A | 7/2007 | |

OTHER PUBLICATIONS

Office Action mailed Jul. 22, 2013 for the related U.S. Appl. No. 13/572,360.
Appeal Decision mailed Apr. 2, 2013 for the corresponding Japanese Application No. 2006307307.
Notice of Allowance mailed Jun. 4, 2013 for the corresponding Japanese Application No. 2006-305508.
Office Action of the corresponding Japanese Application No. 2008-095008 mailed Aug. 28, 2012.
Official Inquiry mailed Nov. 27, 2012 for the corresponding Japanese Patent Application No. 2006-307307.
Office Action mailed Dec. 6, 2012 for the corresponding Taiwanese Patent Application No. 096109518.
Office Action mailed Feb. 25, 2013 for the related Taiwanese Patent Application No. 096138019.
Office Action mailed Apr. 2, 2013 for the related U.S. Appl. No. 13/572,360.
Office Action of the corresponding Japanese Application No. 2006-305409 mailed May 8, 2012.
Decision of Rejection of the corresponding Japanese Application No. 2006-307307 mailed May 8, 2012.
Yanagida et al., Frontier developments of thin film solar cells-towards higher efficiency, large scale production, and widespread promotion, Mar. 10, 2005, pp. 112-115, NTS Corporation (partial English translation provided).
European Search Report mailed on Dec. 27, 2010 for the corresponding European Application No. 08740650.0.
Office Action of the related U.S. Appl. No. 12/596,125 mailed Nov. 2, 2011.
Office Action and Form PTO-892 mailed Feb. 14, 2012 for the related U.S. Appl. No. 12/444,720.
Office Action mailed Jun. 22, 2011 for the related U.S. Appl. No. 12/444,720.
Office Action mailed Dec. 16, 2013 for the parent U.S. Appl. No. 12/306,884.
Office Action mailed Jun. 6, 2013 for the parent U.S. Appl. No. 12/306,884.
Office Action mailed Aug. 16, 2012 for the parent U.S. Appl. No. 12/306,884.
Office Action mailed Apr. 4, 2012 for the parent U.S. Appl. No. 12/306,884.
Office Action mailed Oct. 26, 2011 for the parent U.S. Appl. No. 12/306,884.
Office Action mailed Jul. 7, 2011 for the parent U.S. Appl. No. 12/306,884.
Wikipedia, "Particle size(grain size)" retrieved on Oct. 31, 2012.
Wikipedia, "Particle-size distribution" retrieved on Nov. 8, 2012.
Yagi et al., "Experimental tests of the elementary mechanism responsible for creep deformation in nanocrystalline gold", *Physical Review*, Oct. 20, 2006, pp. 144105-1144105-7.
Oechsle, "Influence of primary grain size on wear and mechanical properties of HVOF carbide coatings", *International Thermal Spray Conference & Exposition*, May 14-17, 2007, Beijing, China (Summary Only).
International Search Report mailed Jun. 26, 2007 for the corresponding PCT Application No. PCT/JP2007/055649.
International Search Report mailed Jan. 15, 2008 for the related PCT Application No. PCT/JP2007/069750.
International Search Report mailed May 20, 2008 for the related PCT Application No. PCT/JP2008/057595.
Office Action mailed Apr. 30, 2014 for the related Japanese Application No. 2013-013983 Submitted in the parent application (U.S. Appl. No. 12/306,884)).
Office Action mailed May 1, 2014 for the related U.S. Appl. No. 13/572,360 (Submitted in the parent application (U.S. Appl. No. 12/306,884)).

COMPOSITION FOR MANUFACTURING ELECTRODE OF SOLAR CELL, METHOD OF MANUFACTURING SAME ELECTRODE, AND SOLAR CELL USING ELECTRODE OBTAINED BY SAME METHOD

CROSS REFERENCE TO RELATED APPLICATION

This application is a Divisional of U.S. patent application Ser. No. 12/306,884 filed Dec. 29, 2008, which is the U.S. national phase application under 35 U.S.C. §371 of International Patent Application No. PCT/JP2007/055649, filed Mar. 20, 2007, which claims the benefit of Japanese Patent Applications No. 2006-181818, filed on Jun. 30, 2006, No. 2006-277230, filed on Oct. 11, 2006, No. 2006-288528, filed on Oct. 24, 2006, No. 2006-288529, filed on Oct. 24, 2006, No. 2006-288530, filed on Oct. 24, 2006, No. 2006-305409 filed on Nov. 10, 2006, No. 2006-305508, filed on Nov. 10, 2006, and No. 2006-307307 filed on Nov. 14, 2006, all of which are incorporated herein by reference in their entirety. The International Application was published in Japanese on Jan. 3, 2008 as WO/2008/001518 under PCT Article 21(2).

FIELD OF THE INVENTION

The present invention relates to a composition for manufacturing an electrode of a solar cell, a method of manufacturing the same electrode, and a solar cell using an electrode obtained by the same method. The present invention also relates to a method of manufacturing an electrode of a solar cell, and to a solar cell equipped with an electrode obtained by the same method.

BACKGROUND OF THE INVENTION

Conventionally, there has been disclosed a method of manufacturing an electrode of a solar cell, comprising: forming a lower electrode layer by coating and baking a first solution coated on a photoelectric conversion semiconductor layer; and forming an upper electrode layer by coating and baking a second solution on a photoelectric conversion semiconductor layer. In this method, the first solution includes ultrafine metal particles having a grain size of 0.03 μm or less which are dispersed in an organic solvent having a low molecular number of about 100 to 200, and the second solution includes ultrafine metal particles in the same or higher weight concentration than in the first solution used in the above-described formation of the lower electrode layer (For example, see Claim 1, paragraph [0024], and paragraph [0035] of Patent Reference 1: Japanese Patent No. 3287754). In this method of manufacturing metal electrodes, ultrafine metal particles are dispersed in the solution, and the viscosity of the solution is controlled to be about 10000 cps. The solution is coated on the photoelectric conversion semiconductor layer by a screen printing method or the like. After that, the metal electrode (the upper electrode layer or the lower electrode layer) is formed by baking the solution for 30 minutes or more at 100 to 250° C., and preferably at 250° C.

In the thus constituted method of manufacturing metal electrodes of a solar cell, the solution dispersing ultrafine metal particles in the organic solvent is coated on the photoelectric conversion semiconductor layer, and subsequently the solution is baked at a low temperature of 100 to 250° C. By this method, it is possible to obtain metal electrodes having high reflectance, high conductivity, and large area without using high-vacuum process.

An electric-conductive composition consisting of Ag powder; at least one metal selected from V, Mo, and W; glass frit; and an organic vehicle is disclosed as a composition used in a method of manufacturing electrodes of a solar cell (for example, see claim 2, paragraph [0022] and paragraph [0031] of Patent Reference 2: Japanese Unexamined Patent Application, First Publication, No. Hei 10-326522). In the above-described Patent Reference 2, a base material printed with the electric-conductive composition for a solar cell is subjected to baking for five minutes at 550° C., thereby forming a Ag electrode. By using the electric-conductive composition for a solar cell described in Patent Reference 2, it is possible to remarkably enhance the sinterability of an Ag electrode. Specifically, it is possible to improve the electric conductivity and film-strength of an electrode under a low-temperature baking at 700° C. or less. Therefore, it is possible to contribute to cost-reduction by decreasing the baking temperature, and formation of electrodes in a case where a treatment temperature of a substrate element is restricted by an upper limit.

Patent Reference 3 discloses an electric-conductive paste formed by mixing a metal powder, an oxide powder, and a vehicle. The metal powder is a powder of at least one metal selected from a group consisting of Ag, Cu, and Ni. The oxide powder is a crystalline powder of a complex oxide that includes at least one selected from a group consisting of Bi, Fe, and Ag, and at least one selected from group V elements and group VI elements of a periodic table (for example, see Claims 1 to 3, paragraph [0009], [0031] of Patent Reference 3: Japanese Unexamined Patent Application, First Publication, No. H11-329070). In the above-described Patent Reference 3, an electrode is formed by baking a wafer printed with the electric-conductive paste, where the maximum baking temperature is 750° C. By using the electric-conductive paste described in the Patent Reference 3, it is possible to form an electrode having low contact resistivity and high bonding-strength certainly.

Further, Patent Reference 4 discloses a method of manufacturing a solar cell element comprising: forming an area of one type electric-conductivity on one main surface of a semiconductor substrate that provides another type conductivity; forming an anti-reflection film on the main surface of the semiconductor substrate; and bake-printing a raw material of an electrode on another main surface of the semiconductor substrate opposite to the anti-reflection film, wherein the raw material comprises silver powder, an organic vehicle and glass frit, and the raw material further comprises one or a plurality of species selected from Ti, Bi, Co, Zn, Zr, Fe, and Cr components (for example, see Claim 1, paragraph [0027], paragraph [0039] of Patent Reference 4: Japanese Unexamined Patent Application, First Publication, No. 2001-313400). In the above-described Patent Reference 4, a solar cell element is formed by bake-printing the paste at 700° C. In the method shown in the Patent Reference 4, even when the raw material of an electrode is coated and baked on the anti-reflection film, it is possible to obtain a solar cell element having a satisfactory ohmic contact (fill factor), and a strong tensile-strength.

A method of forming an electric-conductive coating by coating and heating an electric-conductive composition has been conventionally disclosed as a method of forming a metal electrode on a semiconductor substrate using a raw material containing fine metal particles, for example, an electric-conductive paste. In this conventional method, the electric-conductive composition contains particulate silver compounds, reducing agent and a binder, where the silver compounds may be silver oxide, silver carbonate, and silver acetate or the like (for example, see claims 1 to 3, 11, lines 32-33 on page 3 of Patent Reference 5: PCT International Patent Application, Publication No. 2003/085052). According to the method of Patent Reference 5, without using a high-temperature film formation conditions, it is possible to obtain an electric-conductive film of low volumetric resistivity and high conductivity similar to those of metallic silver.

There has been disclosed an electric-conductive paste and a method of manufacturing a solar cell using the electric-conductive paste. The electric-conductive paste comprises an organic binder, a solvent, glass frit, and an electric-conductive powder, wherein the paste contains a powder of metal or metal compound including at least one selected from Ti, Bi, Zn, Y, In, and Mo, and having an average grain size of not less than 0.001 µm and less than 0.1 µm. The solar cell is produced by printing or coating the electric-conductive paste on an anti-reflection layer of a silicon semiconductor substrate, and subsequently baking the substrate. (For example, see claims 1, 6, paragraphs [0021] of Patent Reference 6: Japanese Unexamined Patent application, First Publication No. 2005-243500). In the electric-conductive paste shown in the above-described Patent reference 6, it is preferred to bake the substrate printed or coated with the electric-conductive paste at a temperature of 550 to 850° C., thereby forming the electrode. According to the Patent Reference 6, additive of ultra fine particles are uniformly dispersed. By baking the substrate, it is possible to form a surface electrode having high conductivity and superior bonding strength between the semiconductor and the electric-conductive paste interposing the anti-reflection layer.

Problems to be Solved by the Invention

In the conventional method of forming metal electrodes of a solar cell shown in the above-described patent reference 1, in order to stabilize the ultrafine metal particles in the metal electrode after the baking, it is necessary to protect the ultrafine metal particles by an organic material having a low molecular weight of about 100 to 200 while ensuring a predetermined electric conductivity. On the other hand, when the size of the ultra-fine metal particles is reduced so as to sinter the ultra-fine metal particles dispersed in the organic solvent at a low temperature, the proportion of the organic material is increased because of increasing specific surface area of the ultra-fine metal particles.

Therefore, in the above-described conventional method of forming metal-electrodes of a solar cell described in the above-described patent reference 1, low-temperature sintering of the ultra-fine metal particles dispersed in the organic solvent cannot be realized without desorbing or decomposing (isolating combusting) the organic material. Where the metal-electrode obtained by baking the ultra-fine metal particles dispersed in the organic solvent at 220° C. or less is subjected to a weathering test by storing the metal electrode for 1000 hours in a thermo-hygrostat while retaining the temperature at 100° C. and the humidity of 50%, there has been a problem of reduction of electric conductivity and reflectance caused by the alteration or deterioration of the organic material.

As shown in the above-described Patent References 2 to 4, where the base material is made of a silicon substrate, ceramic substrate, or a glass substrate, it is possible to form a film with high bonding strength by using a high-temperature baked type thick-film paste that utilizes glass frit or its alternative material so as to enhance the bonding strength to the substrate. However, the compositions forming the electrodes described in the patent references 2 to 4 have to be baked at a temperature of not lower than 500° C. At that temperature, there has been a problem of harming the base material.

Where a base material is made of macromolecule substrate such as an organic polymer substrate, an electric-conductive adhesive containing an organic-based adhesive or a low-temperature polymer type thick film paste containing an organic binder is also used to enhance bonding strength. In this type of paste, electric conductivity is obtained by baking at 200° C. or less. By this baking, thermal shrinkage of the binder occurs making the electric-conductive fine particles contact with each other. However, there have been problems. For example, the presence of an insulating binder in the interstices of the particles results in a large component of contact resistance between the electric-conductive particles, causing high volume resistivity of the formed electrode, and keeping the electric conductivity at low value.

In the method of manufacturing electrodes of a solar cell shown in the above-described Patent Reference 5, it is possible to achieve an electrode made of metallic film having a volume resistivity close to a bulk metal. However, it is difficult to obtain a film having a high adhesion to the base material.

In addition, in the method shown in the above-described Patent Reference 6, it is necessary to melt the glass frit. Therefore, it is necessary to perform the baking at a temperature of not lower than 300° C., that is, a softening temperature of a borosilicate glass applied as a representative glass frit. The preferred baking temperature is also high in the Patent Reference 6. Therefore, for example, in the case of bonding to an amorphous silicon base material of a solar cell, there are problems such as deterioration of conversion efficiency. In addition, since the baking temperature is higher than a heat-proof temperature of most of resins, it is difficult to apply the method to base materials basically made of resins.

SUMMARY OF THE INVENTION

An object of the present invention is to provide a composition for manufacturing an electrode of a solar cell, and a method of manufacturing an electrode of a solar cell using the composition, wherein the electrode can maintain high electric conductivity and high-reflectance under an age-long use, and has excellent secular stability (aging stability).

Another object of the present invention is to provide a method of manufacturing an electrode of a solar cell, and a method of manufacturing a solar cell using the same electrode, wherein an electrode that maintains high electric conductivity and high-reflectance under an age-long use, and has excellent secular stability can be provided by a low-temperature baking at 130 to 400° C.

Another object of the present invention is to provide a composition for manufacturing an electrode of a solar cell, a method of manufacturing an electrode of a solar cell, and a solar cell utilizing the composition and the method, while ensuring adhesion of the above-described composition, and providing an electrode having excellent adhesion in addition to the above-described properties.

Still another object of the present invention is to provide a composition for manufacturing an electrode of a solar cell, a method of manufacturing the solar cell, and a solar cell utilizing an electrode obtained by the production method, wherein a vacuum process is not required during a film formation, the electrode has a satisfactory texture (structure), and an average surface roughness of the texture can be controlled.

The other object of the present invention is to provide a method of manufacturing an electrode of a solar cell and a solar cell utilizing an electrode obtained by the production method which can produce an electrode having excellent adhesion to the base material.

Another object of the present invention is to provide a method of manufacturing an electrode of a solar cell and a solar cell utilizing an electrode obtained by the production method that can produce an electrode having an excellent electric conductivity.

Still another object of the present invention is to provide a method of manufacturing an electrode of a solar cell and a solar cell utilizing an electrode obtained by the production method that can produce an electrode having an excellent reflectance (reflectivity) of visible light.

Devices for Solving the Problems

A first aspect of the present invention is a composition (composite material) for manufacturing an electrode of a solar cell, comprising metal nanoparticles dispersed in a dispersive medium, wherein the metal nanoparticles contain silver nanoparticles of 75 weight % or more, the metal nanoparticles are chemically modified by a protective agent having an organic molecule main chain comprising a carbon backbone of carbon number of 1 to 3, and the metal nanoparticles contain 70% or more, in number-average, of metal nanoparticles having a primary, grain size (diameter of primary grain) within a range of 10 to 50 nm.

Since the composition according to the first aspect includes many metal nanoparticles having a relatively large size of 10 to 50 nm in primary grain size, the specific surface area of the metal nanoparticles is reduced, and a proportion of the dispersive medium is decreased. Therefore, when an electrode of a solar cell is produced using the composition, organic molecules in the dispersive medium are desorbed or decomposed, or desorbed and decomposed by a heat during the baking. As a result, it is possible to obtain an electrode which does not substantially contain organic material and is mainly composed of silver.

A second aspect of the present invention is a method of manufacturing an electrode of a solar cell, comprising: forming a film by coating the composition for manufacturing an electrode of a solar cell according to the above-described first aspect on a base material (substrate) by wet-coating method such that a thickness of the film after a baking is within a range of 0.1 to 2.0 μm, and baking (firing) the base material having the film formed on an upper surface thereof at 130 to 400° C.

In the method of manufacturing an electrode of a solar cell according to the second aspect, organic molecules in the dispersive medium that have protected the surfaces of the metal nanoparticles are desorbed or decomposed, or desorbed and decomposed by a heat during the baking at a low temperature of 130 to 400° C. As a result, it is possible to obtain an electrode which is substantially free of organic material and is mainly composed of silver.

A third aspect of the present invention is a composition for manufacturing an electrode of a solar cell (composition used in production of a solar cell), comprising metal nanoparticles dispersed in a dispersive medium, wherein the metal nanoparticles contain silver nanoparticles of 75 weight % or more, the metal nanoparticles are chemically modified by a protective agent having an organic molecule main chain comprising a carbon backbone of carbon number of 1 to 3, the metal nanoparticles contains 70% or more in number-average of metal nanoparticles having a primary grain size within a range of 10 to 50 nm, and the composition further comprises one, two or more species of additive selected from a group consisting of metal oxides, metal hydroxides, organic metal compounds, and silicone oils.

In the composition according to the third aspect, the composition contains one, two or more species of additive selected from a group consisting of metal oxides, metal hydroxides, organic metal compounds, and silicone oils. When an electrode of a solar cell is produced using the composition, it is possible to obtain an electrode which is substantially free of organic material, is mainly composed of silver, and has excellent adhesion to the base material. In addition, when an electrode is produced using the composition, it is possible to provide an effect of suppressing grain growth by inter-grain sintering of the metal nanoparticles. Therefore, it is possible to produce an electrode having an excellent texture. In addition, it is possible to control the average surface roughness of the texture. In the production of an electrode using a composition according to the present invention, a vacuum process is not required in the film formation process. Therefore, the process has little constraint, and the running cost of the production appliance can be largely reduced.

A fourth aspect of the present invention is a method of manufacturing an electrode of a solar cell, comprising: forming a film by coating the composition for manufacturing an electrode of a solar cell according to the above-described third aspect on a base material by a wet-coating method such that a thickness of the film after a baking is within a range of 0.1 to 2.0 μm, and baking the base material having the film formed on an upper surface thereof at 130 to 400° C.

In the method of manufacturing an electrode of a solar cell according to the fourth aspect, organic molecules in the dispersive medium that have protected the surfaces of the metal nanoparticles are desorbed or decomposed, or desorbed and decomposed by a heat during the baking at a low temperature of 130 to 400° C. As a result, it is possible to obtain an electrode which is substantially free of organic material and is mainly composed of silver. In addition, by the effect of metal oxide, metal hydro-oxide, organic metal compound, or silicone oil, included as an additive in the composition, chemical bonding or anchor effect with the base material increases, or wetting of the metal nanoparticles with the base material in the time of baking at 130 to 400° C. is improved. As a result, the produced electrode is excellent in adhesion to the base material. In the production method according to the fourth aspect, it is possible to produce an electrode by a simple method including film-forming by wet-coating the composition on the base material, and baking the base material coated with the film. Thus, a vacuum process is not required in the film formation process. Therefore, the process has little constraint, and the running cost of the production appliance can be largely reduced.

The fifth aspect of the present invention is an improved method of manufacturing an electrode of a solar cell, comprising: coating a composition for manufacturing an electrode on a base material by a wet coating method; and baking the base material having an upper surface coated with the film. The method is characterized by performing a primer treatment of the base material.

In the invention according to the fifth aspect, before manufacturing an electrode by coating a composition for forming an electrode on a surface of a base material and baking the base material, the base material is subjected to a primer treatment to form primer coating on the base material. As a result, it is possible to improve the adhesion of the electrode to the base material.

A sixth aspect of the present invention is a method of manufacturing an electrode of a solar cell according to the above-described fifth aspect, wherein the composition comprises metal nanoparticles dispersed in a dispersive medium, the metal nanoparticles contain silver nanoparticles of 75 weight % or more, the metal nanoparticles are chemically modified by a protective agent having an organic molecule main chain comprising a carbon backbone of carbon number of 1 to 3, the metal nanoparticles contain 70% or more, in number-average, of metal nanoparticles having a primary grain size within a range of 10 to 50 nm.

In the invention according to the sixth aspect, by using the above-described composition for manufacturing a solar cell, it is possible to form an electrode having an excellent electric conductivity and high reflectance of visible light at a low temperature of 400° C. or less.

Effect of the Invention

As described-above, in accordance with the present invention, the metal nanoparticles dispersed in the dispersive medium contain silver nanoparticles of 75 weight % or more, the metal nanoparticles are chemically modified by the protective agent having a main chain of organic molecule comprising a carbon backbone of 1 to 3 in carbon number, and metal nanoparticles having a primary grain size within a range of 10 to 50 nm constitute 70% or more, in number average, of the metal nanoparticles Therefore, the specific surface area of the metal nanoparticles is relatively reduced, and a proportion of the dispersive medium is decreased. As a result, if an electrode of a solar cell is produced using the composition, it is possible to obtain an electrode which is mainly composed of silver and substantially organic material free, by desorption or decomposition, or by desorption and decomposition of the organic molecules in the above-described dispersive medium by a heat during the baking. Therefore, even when a solar cell having the above-described electrode is used for long ages, alteration or deterioration of organic material can be avoided, and the electric conductivity and reflectance can be maintained at a high state. Therefore, it is possible to obtain an electrode having excellent secular stability.

By forming a film by coating the above-described composition for manufacturing an electrode on a base material such that the film has a thickness within a range of 0.1 to 2.0 μm after baking, and by subjecting the base material having an upper surface coated with the film to baking at 130 to 400° C., it is possible to obtain an electrode which is mainly composed of silver and substantially organic material free by desorption or decomposition, or by desorption and decomposition of organic molecules in the dispersive medium which have protected the surfaces of the metal nanoparticles.

As a result, as like as the above-described solar cell, the solar cell coated with the electrode can maintain electric conductivity and reflectance at high state even after a long age use. Therefore, it is possible to obtain an electrode having an excellent secular stability.

In the composition for manufacturing a solar cell according to the present invention, the metal nanoparticles dispersed in the dispersive medium contain silver nanoparticles of 75 weight % or more, the metal nanoparticles are chemically modified by the protective agent having an organic molecule main chain comprising a carbon backbone of carbon number of 1 to 3, and the metal nanoparticles contain 70% or more in number-average of metal nanoparticles having a primary grain size within a range of 10 to 50 nm. The composition further comprises one or two or more species of additive selected from a group consisting of metal oxides, metal hydroxides, organic metal compound, and silicone oils.

Where an electrode of a solar cell is produced using the composition, it is possible to obtain an electrode which is mainly composed of silver and substantially free of organic material, and the electrode has an excellent adhesion to the base material. When the electrode is formed using the composition, it is possible to provide an effect of suppressing grain growth by inter-grain sintering of metal nanoparticles. Therefore, it is possible to form an electrode having excellent texture. In addition, it is possible to control the average surface roughness of the texture. In the production of an electrode using the composition according to the present invention, a vacuum process is not required in the time of film formation. Therefore, there is little constraint in the process, and it is possible to largely reduce the running cost of a production appliance.

By forming a film by coating the above-described composition for manufacturing an electrode on a base material such that the film has a thickness within a range of 0.1 to 2.0 μm after the baking, and by baking the base material having an upper surface coated with the film at 130 to 400° C., it is possible to obtain an electrode which is mainly composed of silver and substantially organic material free by desorption or decomposition, or by desorption and decomposition of organic molecules in the dispersive medium which have protected the surfaces of the metal nanoparticles.

As a result, like the above-described solar cell, even when the solar cell coated with the electrode is used for long ages, electric conductivity and reflectance of the electrode are maintained at a high state. Therefore, it is possible to obtain an electrode having secular stability. In addition, by the effect of metal oxide, metal hydroxide, organic metal compound, or silicone oil, included as an additive in the composition, chemical bonding or anchor effect with the base material increases, or wetting of the metal nanoparticles with the base material in the time of baking at 130 to 400° C. is improved. As a result, the thus formed electrode has an excellent adhesion to the base material. In the method of manufacturing an electrode of a solar cell according to the present invention, it is possible to produce an electrode by a simple process including forming a film by wet-coating the composition on a base material, and baking the base material coated with the composition. Since a vacuum process is not required in the film formation, there is little constraint on the process, and it is possible to largely reduce the running cost of production appliance.

In the method of manufacturing an electrode of a solar cell according to the present invention, by performing a primer treatment to form primer coating on the base material before coating the composition for manufacturing the electrode on the base material and baking the base material to form the electrode, it is possible to improve the adhesion between the base material and the formed electrode. Therefore, where an electric-conductive material is used in the base material, it is possible to obtain an electrode having an excellent electric connection by controlling the component and amount of the coating used in the primer treatment.

In the composition for manufacturing an electrode used in the method of manufacturing an electrode of a solar cell, metal nanoparticles dispersed in the dispersive medium contain silver nanoparticles of 75 weight % or more, the metal nanoparticles are chemically modified by a protective agent having an organic molecule main chain comprising a carbon backbone of 1 to 3 in carbon number, and the metal nanoparticles contain 70% or more in number-average of metal nanoparticles having a primary grain size within a range of 10 to 50 nm. Therefore, the specific area of the metal nanoparticles in the composition is relatively reduced, and a proportion of the dispersive medium is decreased.

By forming a film by coating the above-described composition for manufacturing an electrode on a base material such that the film has a thickness within a range of 0.1 to 2.0 μm after the baking, and subjecting the base material having an upper surface coated with the film to baking at 130 to 400° C., it is possible to obtain an electrode which is mainly composed of silver and substantially organic material free by desorption or decomposition, or by desorption and decomposition of organic molecules in the dispersive medium which have protected the surfaces of the metal nanoparticles.

As a result, even though the solar cell coated with the electrode is subjected to long-age use, it is possible to avoid the alteration or deterioration of organic materials, electric conductivity and reflectance are maintained at high state. Therefore, it is possible to obtain an electrode having an excellent secular stability. In addition, since the electrode can be formed by the baking at a low temperature of 400° C. or less, it is possible to reduce the energy consumed in the time of forming an electrode. In addition, it is possible to apply the electrode to a base material basically composed of a material of a low heatproof temperature such as resins or semiconductors, for example, a poly-silicon for a solar cell that causes heat damage by baking at 400° C. or more.

DETAILED DESCRIPTION OF THE INVENTION

Best Mode for Carrying Out the Invention

Best modes for carrying out the present invention are explained in the following.
First Embodiment
A Composition for Manufacturing an Electrode of a Solar Cell A composition for manufacturing an electrode of a solar cell according to the present invention is a composition in which metal nanoparticles are dispersed in the dispersive medium. The above-described metal nanoparticles contain 75 weight % or more, and preferably 80 weight % or more, of silver nanoparticles. The content of the silver nanoparticles was limited to 75 weight % or more over the metal nanoparticles of 100 weight %, since the reflectance of the electrode of the solar cell formed using the composition is reduced where the content of the silver particles is less than 75%. The metal nanoparticles are chemically modified by a protective agent having a main chain of organic molecule comprising a carbon backbone of carbon number of 1 to 3. Carbon number of the carbon backbone of the organic molecule main chain of the protective agent that chemically modifies the metal nanoparticles are limited to be in a range of 1 to 3 based on the following reason. Where the carbon number is 4 or more, it is difficult for a desorption or decomposition (separation, combustion) of the protective agent by the heat in the time of baking to occur. As a result, a large amount of organic residue remains in the above-described electrode, thereby causing a reduction of electric conductivity and reflectance of the electrode by alteration and deterioration of the organic residue.

Preferably, the metal nanoparticles contain 70% or more, more preferably, 75% or more, in number-average, of metal nanoparticles having a primary grain size within a range of 10 to 50 nm. The content of metal nanoparticles having a primary grain size within a range of 10 to 50 nm was limited to 70% or more in number average among the whole metal nanoparticles of 100% based on the following reason. Where the number average was less than 70%, the specific surface area of the metal nanoparticles is increased and the proportion of the organic material is increased. Even though the organic material is composed of organic molecules which easily desorb or decompose (separate, combust) by the heat in the time of baking, because of the large proportion of the organic material, organic residue remains in the electrode and causes reduction of electric conductivity and reflectance of the electrode by alteration or deterioration of the organic molecules. Alternatively, the grain size distribution of the metal nanoparticles is widened, the density of the electrode is easily reduced, and the electric conductivity and the reflectance of the electrode is reduced. The primary grain size of the metal nanoparticles was limited to be in the range of 10 to 50 nm, since the metal nanoparticles having a primary grain size of 10 to 50 nm are related to a chronologic stability (aging stability).

On the other hand, metal nanoparticles other than the silver particles are composed of one species or mixed phase or alloy of two or more species selected from a group consisting of Au, Pt, Pd, Ru, Ni, Cu, Sn, In, Zn, Cr, Fe and Mn. Among the 100 weight % as a whole, the metal nanoparticles other than the silver nanoparticles are contained in an amount 0.02 weight % or more and less than 25 weight %, preferably 0.03 weight % to 20 weight %. The content of the metal nanoparticles other than the silver particles was limited to 0.02 weight % or more and less than 25 weight % among 100% as the whole of the metal nanoparticles based on the following reason. Although a content of less than 0.02 weight % does not cause severe problems, the content within the range of 0.02 to 25 weight % is characterized in that the electric conductivity and reflectance of the electrode after the weathering test (a test by storing the metal electrode for 1000 hours in a thermo-hygrostat while retaining a temperature of 100° C. and a humidity of 50%) is not deteriorated compared to those before the weathering test. Where the content is 25 weight % or more, electric conductivity and reflectance of the electrode directly after the baking are deteriorated, and electric conductivity and reflectance are deteriorated in the electrode after the weathering test compared to the electrode before the weathering test.

Preferably, the content of metal nanoparticles including the silver nanoparticles is 2.5 to 95.0 weight %, more preferably 3.5 to 90 weight %, among 100 weight % as the whole composition including the metal nanoparticles and dispersive medium. The content of metal nanoparticles including the silver nanoparticles was limited to be in the range of 2.5 to 95.0 weight % among 100 weight % as the whole composition including the metal nanoparticles and dispersive medium based on the following reason. Although there is no specific influence on the property of electrode after the baking if the content of the metal nanoparticles is less than 2.5 weight %, it is difficult to obtain an electrode having a required thickness. Where the content exceeds 95.0 weight %, the composition loses a necessary fluidity as an ink or a paste in the time of wet coating the composition.

The dispersive medium as a constituent of the composition is preferably composed of an alcohol group or aqueous solution containing an alcohol group. As the alcohol group used as a dispersive medium, it is possible to apply one or two or more selected from the group consisting of methanol, ethanol, propanol, butanol, ethylene glycol, propylene glycol, diethylene glycol, glycerol, iso-bonyl hexanol, and erythritol. Among 100 weight % as the whole dispersive medium, the aqueous solution containing alcohol group preferably contains 1 weight % or more, more preferably 2 weight % or more of water, and 2 weight % or more, preferably 3 weight % or more of alcohol. For example, if the dispersive medium consists only of water and the alcohol group, the dispersive medium contains 98 weight % of alcohol where the water content is 2 weight %, while the dispersive medium contains 2 weight % of water where the alcohol content is 98 weight % or more. Water content among 100 weight % as the whole of the dispersive medium was limited to be 1 weight % or more based on the following reason. Where the water content is less than 1 weight %, it is difficult to perform low temperature sintering of the film obtained by coating the composition through wet coating method, and electric conductivity and reflectance of the electrode are reduced. The content of alcohol group among 100 weight % as the whole of the dispersive medium was limited to be 2 weight % or more based on the following reason. Where the alcohol content is less than 2 weight %, for the same as the above-described reason, it is difficult to perform low temperature sintering of the film obtained by coating the composition using a wet coating method, and electric conductivity and reflectance of the electrode are reduced.

The dispersive medium, that is, the protective agent chemically modifying the surfaces of the metal nanoparticles, preferably contains one or both of hydroxyl group (—OH) and carbonyl group (—C=O). If the hydroxyl group (—OH) is contained in the protective agent chemically modifying the metal nanoparticles such as silver nanoparticles, the protective agent is excellent in stable dispersion of the composition and has an advantageous effect on the low-temperature sintering of the coating. Where a carbonyl group (—CO) is contained in the protective agent chemically modifying the metal nanoparticles such as silver nanoparticles, as like as the above-described case, the protective agent is excellent in stable dispersion of the composition and has an advantageous effect on the low-temperature sintering of the coating.

Method of Manufacturing the Composition.

A method of manufacturing the thus-constituted composition for manufacturing an electrode of a solar-cell is explained.

(a) The Case of Using Silver Nanoparticles Chemically Modified by a Protective Agent having an Organic Molecule Main Chain Comprising a Carbon Backbone of Carbon Number of 3.

Firstly, an aqueous solution of metallic salt is prepared by dissolving silver nitrate in water such as deionized water. On the other hand, aqueous solution of sodium citrate of 10 to 40% in concentration is obtained by dissolving sodium citrate in water such as deionized water. In a gas flow of an inert gas such as nitrogen gas, particulate or powdered ferrous sulfate is directly added and dissolved in the solution. Thus, an aqueous solution of a reducing agent containing citric ion and ferrous ion in a molar ratio of 3:2 is prepared. Next, while agitating the aqueous solution of the reducing agent in the above-described gas flow of the inert gas, the above-describe aqueous solution of metallic salt is dropped in and mixed with the aqueous solution of the reducing agent. Here, the added amount of the aqueous solution of the metallic salt is preferably controlled to be not more than 1/10 of the amount of the aqueous solution of the reducing agent. In this case, the reaction temperature is kept at 30 to 60° C. even when the aqueous solution of metallic salt at room temperature is dropped. In addition, a mixing ratio of the above-described two aqueous solutions is controlled such that an equivalent amount of the ferrous ion added as the reducing agent is three times the equivalent amount of the metallic ion. That is, the mixing ratio is controlled to satisfy (the number of moles of metal ions in the aqueous solution of metallic salt)×(the valence of metal ion)=3×(the number of moles of ferrous ions in the aqueous solution of a reducing agent). After terminating dropping of the aqueous solution of the metallic salt, agitation of the mixed solution is further continued for 10 to 300 minutes. Thus, a fluid dispersion comprising colloidal metal is prepared. The fluid dispersion is left at room temperature, and sedimented agglomerates of metal nanoparticles are separated, for example, by decantation or by centrifugal separation. After that, the thus separated material is made to a dispersed material by adding water such as deionized water, and is subjected to deionization treatment by ultrafiltration, and is further subjected to replacement cleaning by an alcohol group, thereby controlling the content of metal (silver) to be 2.5 to 50 weight %. After that, coarse particles are separated using a centrifugal separator while controlling the centrifugal force of the separator. Thus, the metal nanoparticles are controlled to contain 70% or more in number-average of metal nanoparticles having a primary grain size within a range of 10 to 50 nm. That is, a proportion of the metal nanoparticles having a primary grain size within a range of 10 to 50 nm is controlled to be 70% or more among 100% as the whole of metal nanoparticles. While the above-description refer to metallic nanoparticles, in the case of (a), the proportion of silver nanoparticles having a primary grain size within a range of 10 to 50 nm is controlled to be 70% or more among 100% as the whole of silver nanoparticles.

The number average can be measured by the following procedure. Firstly, the obtained metal nanoparticles are photographed at a magnification of about 500000 using a Transmission Electron Microscope (TEM). Next, primary grain sizes of 200 particles are measured from the obtained image. Grain size distribution is drawn based on the result of the measurement. Next, using the thus drawn grain size distribution, the proportion of the metal nanoparticles having a primary grain size within a range of 10 to 50 nm among the whole metal nanoparticles is determined.

Thus, it is possible to obtain a dispersed material dispersing silver nanoparticles chemically modified by the protective agent having an organic molecule main chain comprising a carbon backbone of carbon number of 3.

Next, the thus obtained dispersed material is controlled such that the final content of metals (silver content) among 100 weight % of the dispersed material is within the range of 2.5 to 95 weight %. Where the dispersed material is configured as an aqueous solution, it is preferable to control the water and alcohol group as a solvent to be 1% or more and 2% or more. Next, one or two or more additive selected from metal oxides, metal-hydroxides, and organic metal compounds is further contained. Content of the additive is controlled to be in the range of 1/1000 to 1/5 of the weight of silver particles. Thus, a composition for manufacturing an electrode is obtained. In the composition, silver nanoparticles chemically modified by the protective agent having a main chain of organic molecule comprising a carbon backbone of carbon number of 3 are dispersed in the dispersive medium, and one, two or more additives selected from the group consisting of metal oxides, metal-hydroxides, and organic metal compounds is further contained.

(b) In the Case of Using Silver Nanoparticles Chemically Modified by a Protective Agent having an Organic Molecule Main Chain Comprising a Carbon Backbone of Carbon Number of 2.

The dispersed material is prepared in the same manner as in the above-described case (a) while replacing the sodium citrate used in the preparation of an aqueous solution of reducing agent by sodium malate. Thus, a dispersed material dispersing silver nanoparticles chemically modified by a protective agent having a main chain of organic molecule comprising a carbon backbone of carbon number of 2 is obtained.

(c) In the Case of Using Silver Nanoparticles Chemically Modified by a Protective Agent having an Organic Molecule Main Chain Comprising a Carbon Backbone of Carbon Number of 1.

The dispersed material is prepared in the same manner as in the above-described case (a) while replacing the sodium citrate used in the preparation of an aqueous solution of a reducing agent using a sodium glycolate. Thus, a dispersed material dispersing silver nanoparticles chemically modified by a protective agent having a main chain of organic molecule comprising a carbon backbone of carbon number of 1 is obtained.

(d) In the Case of Making a Protective Agent Chemically Modifying Metal Nanoparticles other than Silver Nanoparticles to have an Organic Molecule Main Chain Comprising a Carbon Backbone of Carbon Number of 3.

As a metal constituting the metal nanoparticles other than the silver nanoparticles, it is possible to apply Au, Pt, Pd, Ru, Ni, Cu, Sn, In, Zn, Fe, Cr, or Mn. The dispersed material is produced in the same manner as in the above-describe case (a) while replacing the silver nitrate used in the production of the aqueous solution of metallic salt by chloroaurate, chloroplatinate, palladium nitrate, ruthenium trichlorate, nickel chlorate, cuprous nitrate, tin dichloride, indium nitrate, zinc chloride, iron sulfate, chromium sulfate, or manganese sulfate. In the thus obtained dispersed material (composition for manufacturing an electrode of a solar cell), metal nanoparticles other than silver nanoparticles are chemically modified by a protective agent having a main chain of organic molecule comprising a carbon backbone of carbon number of 3.

Where the carbon number of the carbon backbone of organic molecule main chain of protective agent chemically modifying the metal nanoparticles other than silver nanoparticles is controlled to be 1 or 2, the dispersed material is prepared in the same manner as in the above-described case (b) or (c) while replacing the silver nitrate used in the preparation of the aqueous solution of metallic salt by the above-described species of metallic salt. In the thus obtained dispersed material (composition for manufacturing an electrode of a solar cell), the carbon number of the carbon backbone of organic molecule main chain of protective agent chemically modifying the metal nanoparticles other than silver nanoparticles is 1 or 2.

Production of Electrode.

Production of the electrode is explained with respect to the case of using metal nanoparticles including silver nanoparticles as well as metal nanoparticles other than the silver nanoparticles. Where the dispersed material produced by the method of (a) to include silver nanoparticles is defined as a first dispersed material, and the dispersed material produced by the method of the above-described (d) to include metal nanoparticles other than silver nanoparticles is defined as the second dispersed material, the first dispersed material of 75 weight % or more and the second dispersed material of less than 25 weight % is mixed such that the total content of the first dispersed material and the second dispersed material constitute 100 weight %. As the first dispersed material, as an alternative to the dispersed material produced by the above-described method (a), it is possible to use a silver nanoparticles containing dispersed material produced by the method of (b) or the silver nanoparticles containing dispersed material produced by the method of the above-described (c).

A method of manufacturing an electrode using the thus produced dispersed material (composition for manufacturing an electrode of a solar cell) is explained in the following.

Firstly, the above-described dispersed material (composition for manufacturing an electrode of a solar cell) is coated on a base material using a wet-coating method. The film coated by the wet-coating method is formed such that the film thickness after baking is within a range of 0.1 to 2.0 µm, and preferably, 0.3 to 1.5 µm. The above-described base material may be a substrate made of any one selected from silicon, glass, ceramics including transparent electric-conductive material, macromolecule material, or a metal. Alternatively, the base material may be a layered body of two or more materials selected from a group consisting of silicon, glass, ceramics including transparent electric-conductive material, macromolecule material, or a metal. Preferably, the base material is a solar cell element, or a solar cell element equipped with a transparent electrode. As the transparent electrode, it is possible to apply an indium tin oxide (ITO), antimony-doped tin oxide (Antimony Tin Oxide: ATO), NESA (tin oxide: $SnO_2$), indium zinc oxide (IZO), aluminum doped ZnO (AZO) or the like. Further, a thin film of an dielectric material such as lead-zirconate-titanate (PZT) may be formed on the surface of the base material. As the macromolecule substrate, it is possible to apply a substrate made of an organic polymer such as polyimide, polyethylene-terephthalate (PET) and the like. The above-described dispersed material is coated on the surface of a photo-electric converting semiconductor layer of the solar cell element or on the surface of a transparent electrode of a solar cell element equipped with the transparent electrode.

The film-thickness of the dispersed material formed on the surface of the base material was limited to be within a range of 0.1 to 2.0 µm based on the following reason, Where the film-thickness is less than 0.1 µm, surface resistance is insufficient compared with the required value in the electrode of the solar cell. A thickness exceeding 2.0 µm causes no disadvantage in property, but requires a use of an excessively large amount of material and consumes unnecessary material. The above-described wet coating method is preferably selected from any of a spray-coating method, a dispenser-coating method, a spin-coating method, a knife-coating method, a slit-coating method, an inkjet-coating method, a screen-printing method, off-set printing method, and die-coating method. However, the wet-coating method is not limited to the above-described methods, and it is possible to apply any other method.

In the spray coating method, the dispersed material is atomized by a pressurized air and coated on the base material, or the dispersed material itself is pressurized, atomized, and coated on the base material. In the dispenser-coating method, for example, the dispersed material is stored in an injection syringe. The dispersed material is discharged from a micro nozzle at a tip of the injection syringe by pressing a piston of the injection syringe, thereby being coated on the base material. In the spin coating method, the dispersed material is dropped on the rotating base material, and the dropped dispersed material is spread to the circumference (rim) of the base material by the centrifugal force. In the knife-coating method, the base material is disposed with a predetermined interval from a tip of the knife such that the base material is movable in the horizontal direction, the dispersed material is supplied on the upstream side with respect to the knife on the base material, and the base material is moved towards the down stream direction. In the slit-coating method, the dispersed material is flown out from a narrow slit and is coated on the base material. In the inkjet coating method, the base material is filled in an ink cartridge of a commercially available inkjet printer, and is printed on the surface of the base material by inkjet printing. In the screen printing method, gauze is used as a patterning material, and the dispersed material is transferred to the base material through a block print formed on the gauze. The off-set printing method is a printing method utilizing a repellency of an ink, where the dispersed material adhered on a plate is not directly adhered on the base material, but is once transcripted on a rubber sheet, and then, the dispersed material is transferred from the rubber sheet to the base material. In the die-coating method, the dispersed material supplied in the die is distributed by a manifold, ejected through slit on a thin film, and coated on a surface of a running base material. The die-coating method includes a slot coating method, a slide coating method, and a curtain coating method.

Next, the base material having the film formed on the upper surface is baked by being held at a temperature of 130 to 400° C., and preferably 140 to 200° C., for 10 minutes to 1 hour, preferably 15 to 40 minutes in the air. Here, the thickness of the dispersed material formed on the base material or the baking temperature of the dispersed material formed on the base material was limited to 130 to 400° C. based on the following reason. Where the baking temperature is lower than 130° C., it is impossible to sufficiently sinter the metal nanoparticles with each other, and it is difficult to desorb or decompose (isolate, combust) the protective agent by heat at the time of baking. As a result, a large amount of organic residue remains in the electrode and electric conductivity and reflectance are reduced by alteration or deterioration of the residue. Where the baking temperature exceeds 400° C., it is impossible to utilize productive advantage of low-temperature process. Therefore, the production cost is increased and the productivity is deteriorated. The time of baking the film of the dispersed material formed on the surface of the base material was limited to the range of 10 minutes to 1 hour based on the following reason. Where the time is shorter than 10 minutes, it is impossible to sufficiently sinter the metal nanoparticles with each other, and it is difficult to desorb or decompose (isolate, combust) the protective agent by heat at the time of baking. As a result, a large amount of organic residue remains in the electrode and electric conductivity and the reflectance are reduced by alteration or deterioration of the residue. Where the baking time exceeds 1 hour, although the property is not affected, the production cost increases excessively, and productivity is reduced.

Since the above-described composition for manufacturing an electrode of a solar cell includes large amount of metal nanoparticles having a relatively large size of primary grain size of 10 to 50 nm, the specific surface area of the metal nanoparticles is reduced, and the proportion of the protective agent is reduced. As a result, if an electrode of a solar cell is produced using the above-described composition, by desorption or decomposition, or desorption and decomposition of the organic molecules in the protective agent, it is possible to obtain an electrode which is mainly composed of silver and is substantially free of organic material. Therefore, even when the solar cell formed of the above-described electrode is subjected to a long age use, alteration or deterioration of organic material is avoided, the electric conductivity and reflectance of the electrode is maintained at a high state, and therefore, it is possible to achieve an electrode having excellent secular stability. For example, after storing the above-described electrode for 1000 hours in a thermo-hygrostat maintaining a temperature of 100° C. and a humidity at 50%, the above-described electrode can reflect 80% or more of electromagnetic wave having a wavelength of 750 to 1500 nm, that is the electromagnetic wave of visible region to infrared region, and the electric conductivity, in other words, the volume resistivity of the electrode can be maintained at an extremely low level of less than $2\times10^{-5}\Omega\cdot cm$ ($20\times10^{-6}\Omega\cdot cm$). A solar cell using the thus formed electrode can maintain high electric conductivity and high-reflectance under a long age use and is excellent in secular stability.

Second Embodiment

[Composition]

A composition for manufacturing an electrode of a solar cell according to the present invention may be a composition which has a constitution similar to the composition of the above-described first embodiment, and further contains one or two or more species of additive selected from a group consisting of metal oxides, metal hydroxides, organic metal compounds, and silicone oil. By the effect of the metal oxide, metal hydroxide, organic metal compound, or silicone oil, contained as an additive in the composition, it is possible to improve the adhesion to the base material without deteriorating the electric conductivity. The improvement of the adhesion is performed by chemical bonding with the base material, increased anchor effect, or by improved wetting of the metal nanoparticles with the base material during the baking process at 130 to 400° C.

In addition, if the electrode is produced using this composition, it is possible to impart an effect of suppressing grain growth caused by sintering of metal nanoparticles with each other. Therefore, it is possible to produce an electrode having a satisfactory texture. In addition, it is possible to control the average surface roughness of the texture. Since a vacuum process is not required in the time of film-formation in the production of an electrode of a solar cell using the composition according to the present invention, there is only a small constraint on the process, and it is possible to largely decrease the running cost of the production appliance.

If an electrode is produced using a composition not including the above-described metal oxide or the like, the produced electrode has a large surface roughness. However, it is considered that a photo-electric conversion effect is optimized under specific conditions of unevenness of the surface of the electrode. Therefore, it is impossible to form a surface of an electrode having an excellent photo-electric conversion effect by merely increasing the surface roughness. By controlling the species, concentration or the like of metal oxide or the like, as in the composition of the present invention, it is possible to form a surface having an optimized surface roughness.

A content of the additive is 0.1 to 20%, preferably 0.2 to 10%, of the weight of the silver nanoparticles constituting the metal nano-particles. Where the content of the additive is less than 0.1%, adhesion between the base material and the electrode is not enhanced. Where the content of the additive exceeds 20%, there is an adverse influence on the electric conductivity of the produced electrode, resulting in a disadvantage that the volume resistivity of the electrode exceeds $2\times10^{-5}\Omega\cdot cm$.

As the metal oxide, it is possible to apply an oxide or a complex oxide containing at least one selected from a group consisting of aluminum, silicon, titanium, chromium, manganese, iron, cobalt, nickel, silver, copper, zinc, molybdenum, tin, indium, and antimony. Specific examples of the complex oxide include indium oxide-tin oxide based complex oxide (ITO: Indium Tin Oxide), antimony oxide-tin oxide based complex oxide (Antimony Tin Oxide: ATO), indium oxide-zinc oxide based complex oxide (IZO: Indium Zinc Oxide) or the like. As the metal hydroxide, it is possible to apply a hydroxide containing at least one selected from a group consisting of aluminum, silicon, titanium, chromium, manganese, iron, cobalt, nickel, silver, copper, zinc, molybdenum, tin, indium, and antimony.

As the organic metal compound, it is possible to apply a metal-soap, metal-complex, or metal-alkoxide of silicon, titanium, chromium, manganese, iron, cobalt, nickel, silver, copper, zinc, molybdenum, indium and tin. For example, as the metal soap, it is possible to apply nickel acetate, silver acetate, copper citrate, tin acetate, zinc acetate, zinc oxalate or the like. As the metal complex, it is possible to apply zinc acetilacetonate, chromium acetilacetonate, nickel acetilacetonate, and the like. As the metal alkoxide, it is possible to apply zirconium butoxide, titanium isopropoxide, methyl-silictae, isoanatopropyltrimethoxysilane, aminopropyltrimethoxysilane or the like. As the silicone oil, it is possible to use both of straight silicone oil and modified silicone oil.

As the modified silicone oil, it is possible to apply one of side chain type, two ends type, single end type, or side-chain two-ends type, where an organic radical is introduced to a part of side chains of polysiloxane in the side chain type, organic radicals are introduced to two ends of polysiloxane in the two ends type, an organic radical is introduced to one of two ends of polysiloxane in the single end type, and organic radicals are introduced to a part of side chains and two ends of polysiloxane in the side-chain two ends type. Both species of the modified silicone oil, that is, the reactive silicone oil and the non-reactive silicone oil may be used as the additive according to the present invention. The reactive silicone oil shows an amino modifier, an epoxy modifier, a carboxy modifier, a carbinol modifier, a mercapto modifier, and a different functional group modifier (epoxy radical, amino radical, polyether radical). The non-reactive silicone oil shows a polyether modifier, a methylstyryl modifier, an alkyl modifier, a higher fatty acid ester modifier, a fluorine modifier, and a hydrophilic specific modifier.

Method of Manufacturing a Composition (a) The Case of Using Silver Nanoparticles Chemically Modified by a Protective Agent having a Main Chain Of Organic Molecule Comprising a Carbon Backbone of Carbon Number of 3.

Firstly, in the same manner as in the first embodiment, dispersed material is prepared such that metal (silver) nanoparticles chemically modified by a protective agent having a main chain of organic molecule of a carbon number of 3 are dispersed in a dispersive medium. The thus obtained dispersed material is controlled such that the final (target) content of metal (silver content) is within the range of 2.5 to 95 weight % among 100 weight % of dispersed material. Where the dispersive medium is constituted of an aqueous solution containing an alcohol group, it is preferable to control the water and the alcohol group in the solvent to be 1% or more and 2% or more respectively.

Next, one or two or more of additive selected from the group consisting of metal oxides, metal hydroxides, and organic metal compounds is further added to the dispersed material. The content of the additive is controlled to be in the range of $1/1000$ to $1/5$ of the weight of the silver nanoparticles. By this control, it is possible to obtain a composition for manufacturing an electrode of a solar cell, wherein silver nanoparticles chemically modified by a protective agent having a main chain of organic molecule comprising a carbon backbone of carbon number of 3 are dispersed in the dispersive medium, and one, two or more species of additives selected from the group consisting of metal oxides, metal hydroxides, and organic metal compounds is further contained in the composition.

Similar process can be applied to (b) a case of using silver nanoparticles chemically modified by a protective agent having a main chain of organic molecule comprising a carbon backbone of carbon number of 2, (c) a case of using silver nanoparticles chemically modified by a protective agent having an organic molecule main chain comprising a carbon backbone of carbon number of 1, (d) a case of using metal nanoparticles other than silver nanoparticles chemically modified by a protective agent having a main chain of organic molecule comprising a carbon backbone of carbon number of 3, and a case of using metal nanoparticles other than silver nanoparticles chemically modified by a protective agent having an organic molecule main chain comprising a carbon backbone of carbon number of 1 or 2. In each case, after forming a dispersed material in the same manner as in the first embodiment, one or two or more species of additive selected from the group consisting of metal oxides, metal hydroxides, and organic metal compounds is further added in a manner similar to the above-described case (a). As a result, it is possible to obtain a composition for manufacturing an electrode, wherein metal nanoparticles chemically modified by a protective agent having organic molecule main chain are dispersed in the dispersive medium and one or more species of additive selected from a group consisting of metal oxides, metal hydroxides, and organic metal compounds is further contained.

Where the metal nanoparticles other than silver nanoparticles are included as well as the silver nanoparticles, the composition is prepared in the following manner. A first dispersed material containing silver nanoparticles is produced by any of the above-described method. A second dispersed material containing metal nanoparticles other than silver nanoparticles is produced by the above-described method. The first dispersed material of not less than 75 weight % and the second dispersed material of less than 25 weight % are mixed such that total content of the sum of the first dispersed material and the second dispersed material constitute 100 weight %.

Method of Manufacturing an Electrode

A method of manufacturing an electrode using the thus produced dispersed material (composition for manufacturing an electrode of a solar cell) is explained.

Firstly, the above-described dispersed material (a composition used in manufacturing an electrode of a solar cell) is coated on a base material using a wet-coating method. The film coated by the wet-coating method is formed such that the film thickness after baking is within a range of 0.1 to 2.0 preferably, 0.3 to 1.5 µm. The above-described base material may be a substrate made of any one selected from silicon, glass, ceramics including a transparent electric-conductive material, a macromolecule material, or a metal. Alternatively, the base material may be a layered body of two or more materials selected from a group consisting of silicon, glass, ceramics including transparent electric-conductive material, a macromolecule material, or a metal. Preferably, the substrate is a solar cell element, or a solar cell element equipped with a transparent electrode. As the transparent electrode, it is possible to apply an ITO, an ATO, a NESA, an IZO, an AZO or the like. Further, a thin film of a dielectric material such as lead-zirconate-titanate (PZT) may be formed on the surface of the base material. As the macromolecule substrate, it is possible to apply a substrate made of organic polymer such as polyimide, polyethylene-terephthalate (PET) or the like. The above-described dispersed material is coated on the surface of photo-electric converting semiconductor layer of the solar cell element or on the surface of a transparent electrode of a solar cell element equipped with the transparent electrode. The above-described wet coating method is preferably selected from any of a spray-coating method, a dispenser-coating method, a spin-coating method, a knife-coating method, a slit-coating method, a inkjet-coating method, a screen-printing method, an off-set printing method, and a die-coating method. However, the wet-coating method is not limited to the above-described methods, and it is possible to apply any other method.

Next, the base material having the film formed on the upper surface thereof is baked by holding at a temperature of 130 to 400° C., preferably 200 to 400° C., for 5 minutes to 1 hour, preferably 15 to 40 minutes in the air or in the inert gas atmosphere of nitrogen or argon.

Here, the thickness of the dispersed material formed on the base material is limited to 0.1 to 2.0 µm, and the baking temperature of the dispersed material formed on the base material was limited to 130 to 400° C. based on the same reason as in the first embodiment. The time of baking the film of the dispersed material formed on the surface of the base material was limited to the range of 5 minutes to 1 hour for the following reason. Where the time is shorter than 5 minutes, it is impossible to sufficiently sinter the metal nanoparticles with each other, and it is difficult to desorb or decompose (isolate, combust) the protective agent by heat at the time of baking. As a result, a large amount of organic residue remains in the electrode, and the electric conductivity and the reflectance are reduced by alteration or deterioration of the residue. Where the baking time exceeds 1 hour, although the property is not affected, production cost increases excessively, and productivity is reduced.

Since the above-described composition for manufacturing an electrode of a solar cell includes a large amount of metal nanoparticles having a relatively large size of primary grain size of 10 to 50 nm, the specific surface area of the metal nano-particles is reduced, and the proportion of the protective agent is reduced. As a result, if an electrode of a solar cell is produced using the above-described composition, by desorption or decomposition, or desorption and decomposition of the organic molecules in the protective agent, it is possible to obtain an electrode which is mainly composed of silver and is substantially free of organic material. Therefore, even when the solar cell coated with the above-described electrode is subjected to a long age use, alteration or deterioration of the organic material is avoided, electric conductivity and reflectance of the electrode is maintained at a high state, and therefore, it is possible to achieve an electrode having an excellent secular stability. For example, after storing the above-described electrode for 1000 hours in a thermo-hygrostat maintaining a temperature of 100° C. and a humidity of 50%, the above-described electrode can reflect 80% or more of electromagnetic wave having a wavelength of 750 to 1500 nm, that is the electromagnetic waves from the visible region to the infrared region, and the electric conductivity, in other words, the volume resistivity of the electrode can be maintained at an extremely low level of less than $2 \times 10^{-5} \Omega \cdot cm$.

By baking in accordance with the above-described conditions, it is possible to form an electric-conductive coating (film) on the surface of the base material. Since the thus formed electric-conductive coating is provided with an effect of suppressing grain growth by sintering metal nanoparticles, the coating has a satisfactory texture. In addition, by controlling the species and amounts of additives in the composition to be used, it is possible to obtain a coating having a controlled surface roughness of the texture. It is preferable that the formed electric-conductive coating has an average surface roughness within a range of 10 to 100 nm. The average surface roughness within the above-described range is an appropriate range for a texture of a back-side electrode as a constituent of a substrate-type solar cell. The formed electric-conductive coating is given a resistivity close to a resistivity of a metal itself constituting the metal nanoparticles contained in the composition. In addition, it is possible to obtain an excellent reflectance close to the reflectance of a metal itself constituting the metal nanoparticles contained in the composition.

As explained-above, the method of manufacturing an electrode according to the present invention includes performing film-formation by coating the above-described composition for manufacturing an electrode on a base material using a wet-coating method, and performing baking of a base material having the film coated on the upper surface within the above-described temperature range. According to this production method, it is possible to form an electrode through a simple process using a wet-coating the composition to form a film on the base-material, and baking the base material coated with the film. Thus, a vacuum process can be avoided in the time of film-formation. Therefore, there is only a small constraint on the process, and the running cost of the production appliance can be largely decreased. Further, a solar cell utilizing the thus formed electrode can maintain high electric conductivity and high reflectance after a long age use and has excellent secular stability.

Third Embodiment

A method of manufacturing a solar cell according to the present invention includes forming a film by coating the composition for manufacturing an electrode of a solar cell on a base material using a wet-coating method, and baking the base material having the film formed on an upper surface thereof. Specifically, the production method includes forming the film by coating the composition for manufacturing an electrode of a solar cell on a base material using a wet-coating method such that the thickness of the film after baking is within a range of 0.1 to 2.0 µm, and baking the base material having the film formed on an upper surface thereof at 130 to 400° C. As the composition used in the above-described method of manufacturing an electrode, it is possible to use a composition used in manufacturing an electrode of a solar cell described in the above first embodiment or the second embodiment.

The above-described method of forming an electrode of a solar cell according to the present invention may be constituted to include performing primer treatment of the base material. By performing the primer treatment to form under coating on the base material before coating the composition for manufacturing an electrode on the base material and baking the base material to form the electrode, it is possible to improve the adhesion of the electrode to the base material. The primer treatment is performed by coating the coating material as described below. As the coating material used in the primer treatment, it is preferable to apply a coating material that includes metal oxides of one or two or more selected from the group consisting of Ag, Cu, Sn, Pd, Zn, Ni, Mo, Cr, Mn, Al, Zr, Ti, Ru, Pt, In, and Si. Examples of the metal oxide include $Ag_2O$, $CuO$, $PdO$, $ZnO$, $NiO$, $MoO_2$, $Cr_2O_3$, $MnO_2$, $Al_2O_3$, $ZrO$, $TiO_2$, $In_2O_3$, and $SiO_2$ or the like. In addition, the coating material preferably contains one or two or more of resin. As the resin, it is possible to apply acryl, vinyl acetate, epoxy, polyester, polyurethane, cellulose, polyvinyl pyrrolidone, a modified resin of the above-described resin, or a copolymer that includes the above-described resin as a structural unit. The resin preferably includes a component composed of one or two or more selected from the group consisting of an isocyanate component, a polyester component, and a polyether component. More preferably, all of the above-described three components are included as constituents in the resin. The isocyanate component may be 2,4-tolylene diisocyanate, the polyester component may be polycaprolactone, the polyether component may be polyethylene glycol.

For example, it is possible to apply a copolymer that includes components of 2, 4-tolylene diisocyanate, polycaprolactone, and polyethylene glycol in a molar ratio of 20:50:1. Preferably, the coated material may include one or two or more of alkoxide. As a metal alkoxide, it is possible to apply tetraethoxysilane, tetrabutoxysilane, tetrabutoxy titanium, titanium isopropoxide, zirconium butoxide or the like. Preferably, the coated material may include one or two or more of metal soap. As the metal soap, it is possible to apply calcium stearate, magnesium stearate, zinc stearate, tin 2-ethylhexanate, or the like. Further, the coated material may include one or two or more of coupling agent. As the coupling agent, it is possible to apply 3-mercaptopropylmethyldimethoxysilane, triethanolaminotitanate, or the like.

Method of Manufacturing an Electrode

Next, a method of manufacturing an electrode using a dispersed material (composition for manufacturing an electrode of a solar cell) that has been formed in the same manner as in the first embodiment or the second embodiment is explained.

Firstly, a primer treatment is performed on a surface of the base material. A method of coating the coating material in the time of performing the primer treatment on the base material is preferably selected from any of a spray-coating method, a dispenser-coating method, a spin-coating method, a knife-coating method, a slit-coating method, an inkjet-coating method, a screen-printing method, an off-set printing method, and a die-coating method. However, the primer coating method is not limited to the above-described methods, and it is possible to use any other method. The coating material coated on the base material is dried by holding the base material for 10 seconds to 30 minutes at a temperature of 20 to 100° C. Alternatively, the coating is dried by being exposed to an air current of 20 to 100° C. for 10 seconds to 30 minutes. Preferably, the coating is dried by being exposed to an air current of 40° C. for 15 seconds. As the base material that is subjected to the primer treatment, and subsequently subjected to the formation of the electrode using the composition for manufacturing the electrode, it is possible to apply a substrate selected from silicon, glass, and ceramics including transparent electric-conductive material, macromolecule materials, or a metal. Alternatively, the base material may be a layered body of two or more materials selected from a group consisting of silicon, glass, ceramics including transparent electric-conductive material, macromolecule material, or a metal. In addition, it is possible to use a base material that includes at least one of transparent electric-conductive film or a base material that has a transparent electric-conductive film formed on the surface thereof. As the transparent electric-conductive film, it is possible to apply an indium oxide based film, a tin oxide based film, or a zinc oxide based film. As the indium oxide based film, it is possible to apply indium oxide, ITO, and IZO. As the tin oxide based film, it is possible to apply NESA, ATO, and fluorine-doped tin oxide. As the zinc oxide based film, it is possible to apply zinc oxide, AZO, and gallium doped zinc oxide. Preferably, the base material may be a solar cell element or a solar cell element equipped with a transparent electrode. As the transparent electrode, it is possible to apply ITO, ATO, NESA, IZO, AZO, or the like. As the macromolecule substrate, it is possible to apply a substrate made of an organic polymer such as polyimide, polyethyleneterephthalate (PET) or the like. The primer treatment is performed on the surface of a photoelectric conversion semiconductor layer of the solar cell element, or on the surface of the transparent electrode of the solar cell element equipped with the transparent electrode, or the like.

Next, the above-described composition (for example, the composition described in the first embodiment) for forming an electrode of a solar cell is coated on the surface of the base material which has been subjected to the primer treatment using a wet coating method. The film coated by the wet-coating method is formed such that the film thickness after baking is within a range of 0.1 to 2.0 µm, and preferably, 0.3 to 1.5 µm. The wet coating method is preferably selected from any of a spray-coating method, a dispenser-coating method, a spin-coating method, a knife-coating method, a slit-coating method, an inkjet-coating method, a screen-printing method, a off-set printing method, and a die-coating method. However, the wet-coating method is not limited to the above-described methods, and it is possible to apply any other method.

Next, the base material having the film formed on the upper surface thereof is baked by being held at a temperature of 130 to 400° C., and preferably 140 to 300° C., for 10 minutes to 1 hour, and preferably 15 to 40 minutes in the air. Here, the film-thickness of the dispersed material formed on the surface of the base material was limited to be within a range of 0.1 to 2.0 µm based on the following reason. Where the film-thickness is less than 0.1 µm, the surface resistance of the electrode is insufficient compared with the value required in the solar cell. The thickness exceeding 2.0 µm causes no disadvantage in property, but requires use of an excessively large amount of material and consumes unnecessary material. The baking temperature of the dispersed material formed on the base material was limited to 130 to 400° C. based on the following reason. Where the baking temperature is lower than 130° C., it is impossible to sufficiently sinter the metal nanoparticles with each other, and it is difficult to desorb or decompose (isolate, combust) the protective agent by heat at the time of baking. As a result, a large amount of organic residue remains in the electrode and the electric conductivity and the reflectance are reduced by alteration or deterioration of the residue. Where the baking temperature exceeds 400° C., it is impossible to utilize a productive advantage of a low-temperature process. Therefore, the production cost is increased and the productivity is deteriorated. The time of baking the film of the dispersed material formed on the surface of the base material was limited to the range of 10 minutes to 1 hour based on the following reason. Where the time is shorter than 10 minutes, it is impossible to sufficiently sinter the metal nanoparticles with each other, and it is difficult to desorb or decompose (isolate, combust) the protective agent by heat at the time of baking. As a result, a large amount of organic residue remains in the electrode and the electric conductivity and the reflectance are reduced by alteration or deterioration of the residue. Where the baking time exceeds 1 hour, although the property is not affected, the production cost increases excessively, and productivity is reduced.

Since the above-described composition for manufacturing an electrode of a solar cell includes a large amount of metal nanoparticles having relatively large size of primary grain size of 10 to 50 nm, the specific surface area of the metal nanoparticles is reduced, and the proportion of the protective agent is reduced. As a result, if an electrode of a solar cell is produced using the above-described composition, by desorption or decomposition, or desorption and decomposition of the organic molecules in the protective agent, it is possible to obtain an electrode which is mainly composed of silver and is substantially free of organic material. Therefore, even when the solar cell formed with the above-described electrode is subjected to a long age use, alteration or deterioration of organic material is avoided, the electric conductivity and reflectance of the electrode are maintained at a high state, and therefore, it is possible to achieve an electrode having excellent secular stability. For example, after storing the above-described electrode for 1000 hours in a thermo-hygrostat maintaining a temperature of 100° C. and a humidity of 50%, the above-described electrode can reflect 80% or more of an electromagnetic wave having a wavelength of 750 to 1500 nm, that is the electromagnetic wave ranging from a visible region to an infrared region, and the electric conductivity, in other words, the volume resistivity of the electrode can be maintained at extremely low level of less than $2\times10^{-5}\Omega\cdot cm$ ($20\times10^{-6}\Omega\cdot cm$). A solar cell using the thus formed electrode can maintain high electric conductivity and high-reflectance under a long age use and has excellent secular stability.

EXAMPLES

In the following, Examples of the present invention and Comparative Examples are explained in detail.

Example A1

Firstly, an aqueous solution of metallic salt was prepared by dissolving silver nitrate in deionized water. On the other hand, sodium citrate was dissolved in deionized water to obtain an aqueous solution of sodium citrate of 26% in concentration. In a gas flow of nitrogen at a temperature of 35° C., particulate ferrous sulfate was directly added and dissolved in the solution. Thus, an aqueous solution of a reducing agent containing citric ion and ferrous ion in a molar ratio of 3:2 was prepared. Next, while maintaining the temperature 35° C. of the above-described nitrogen gas flow, and while agitating the above-described aqueous solution of a reducing agent by rotating an agitator of a magnetic stirrer at a rotation rate of 100 rpm, the above-described aqueous solution of metallic salt was dropped and mixed in the aqueous solution of a reducing agent. Here, by controlling the concentration of each solution such that the added amount of the aqueous solution of metallic salt was ⅒ or less of the amount of the aqueous solution of reducing agent, reaction temperature was maintained at 40° C. even when the aqueous solution of metallic salt at a room temperature was dropped. The mixing ratio of the above-described two aqueous solution was controlled such that an equivalent amount of the ferrous ion added as a reducing agent was three times an equivalent amount of the metallic ion. After ceasing dropping of the aqueous solution of metallic salt, agitation of the mixed solution was continued for a further 15 minutes, thereby obtaining a fluid dispersion comprising colloidal metal (metal colloid). The fluid dispersion has a pH of 5.5, and the stoichiometric amount of metal particles generated in the fluid dispersion was 5 g/liter. The thus obtained fluid dispersion was left at room temperature, and sedimented agglomerates of metal nanoparticles were separated by decantation.

Deionized water was added to the separated material to obtain a dispersed material. The dispersed material was subjected to desalting by ultrafiltration, and was subsequently subjected to replacement cleaning (exchange cleaning) by methanol. Thus, content of metal (silver) was controlled to be 50 weight %. After that, coarse particles were separated by a centrifugal separator. By controlling the centrifugal force of the centrifugal separator, silver nanoparticles were controlled to include 71% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 71% in number average. The dispersed material was defined as Example A1. Among 100 weight % of the dispersed material, the mixing ratio of the metal (silver), water, methanol, and solvent A were each controlled to be 50.0 weight %, 2.5 weight %, 5.0 weight %, and 42.5 weight %, where the solvent A denotes a mixed solution of acetone and isopropylglycol in a mixing ratio in weight ratio of 1:1. The silver nanoparticles in the dispersed material were chemically modified by the protective agent having an organic molecule main chain comprising a carbon backbone of carbon number of 3. The protective agent chemically modifying the silver nanoparticles did not contain hydroxyl group (—OH) but contained carbonyl group (—C═O). The iron in the ferrous sulfate was removed during the replacement cleaning using methanol.

Example A2

A fluid dispersion obtained in the same manner as in the Example A1 was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning by ethanol. Thus, content of metal was controlled to be 50 weight %. After that, coarse particles were separated by a centrifugal separator. By controlling the centrifugal force of the centrifugal separator, silver nanoparticles were controlled to include 72% in number average of silver nanoparticles having a primary grain size of 10 to 50 nm. That is, among the whole silver nanoparticles constituting 100%, the proportion of silver nanoparticles having a primary grain size of 10 to 50 nm was controlled to be 72% in number average. The dispersed material was defined as Example A2. Among 100 weight % of the dispersed material, final (target) mixing ratio of the metal (silver), water, ethanol, and solvent A were each controlled to be 50.0 weight %, 4.0 weight %, 5.0 weight %, and 41.0 weight %. The silver nanoparticles in the dispersed material were chemically modified by the protective agent having a main chain of organic molecule comprising a carbon backbone of carbon number of 3. The protective agent chemically modifying the silver nanoparticles did not contain hydroxyl group (—OH) but contained a carbonyl group (—C═O).

Example A3

A dispersed material which was subjected to replacement cleaning by ethanol in the same manner as in the Example A2 was controlled by centrifugal separator such that the silver nanoparticles included 73% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 73% in number average. The dispersed material was defined as Example A3. Among 100 weight % of the dispersed material, the final (target) mixing ratio of the metal (silver), water, ethanol, and solvent B were each controlled to be 50.0 weight %, 1.0 weight %, 5.0 weight %, and 44.0 weight %, where the solvent B denotes a mixed solution of cyclohexane and methyl ethyl ketone in a mixing ratio in weight ratio of 1:1. The silver nanoparticles in the dispersed material were chemically modified by the protective agent having an organic molecule main chain comprising a carbon backbone of carbon number of 3. The protective agent chemically modifying the silver nanoparticles did not contain hydroxyl group (—OH) but contained carbonyl group (—C═O).

Example A4

A dispersed material which was subjected to replacement cleaning by ethanol in the same manner as in the Example A2 was controlled by centrifugal separator such that the silver nanoparticles included 75% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 75% in number average. The dispersed material was defined as Example A4. Among 100 weight % of the dispersed material, the final (target) mixing ratio of the metal (silver), water, and ethanol were each controlled to be 50.0 weight %, 48.0 weight %, and 2.0 weight %. The silver nanoparticles in the dispersed material were chemically modified by the protective agent having an organic molecule main chain comprising a carbon backbone of carbon number of 3. The protective agent chemically modifying the silver nanoparticles did not contain hydroxyl group (—OH) but contained a carbonyl group (—C=O).

Example A5

A dispersed material which was subjected to replacement cleaning by ethanol in the same manner as in the Example A2 was controlled by a centrifugal separator such that the silver nanoparticles included 75% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 75% in number average. Thus, a first dispersed material was obtained. On the other hand, a dispersed material was prepared by replacing silver nitrate in Example A2 with chloroaurate. After replacement cleaning by ethanol in the same manner as in the Example A2, the dispersed material was controlled by a centrifugal separator such that gold nanoparticles included 75% in number average of gold nanoparticles having a primary grain size of 10 to 50 nm. That is, among the whole gold nanoparticles constituting 100%, the proportion of the gold nanoparticles having a primary grain size of 10 to 50 nm was controlled to be 75% in number average. Thus, a second dispersed material was obtained. Next, the first dispersed material of 95 weight % and the second dispersed material of 5 weight % were mixed. This dispersed material was defined as Example A5. Among 100 weight % of the dispersed material, the final (target) mixing ratio of the metal (sum of silver and gold), water, and ethanol were each controlled to be 50.0 weight %, 3.5 weight %, and 46.5 weight %. The silver nanoparticles and the gold nanoparticles in the dispersed material were chemically modified by the protective agent having a main chain of organic molecule comprising a carbon backbone of carbon number of 3. The protective agent chemically modifying the silver nanoparticles and gold nanoparticles did not contain hydroxyl group (—OH) but contained a carbonyl group (—C=O).

Example A6

In the same manner as in the Example A2, a first dispersed material was obtained while controlling the silver nanoparticles to include 71% in number average of silver nanoparticles having a primary grain size of 10 to 50 nm by controlling the centrifugal separator. That is, among the whole silver nanoparticles constituting 100%, proportion of the silver nanoparticles having a primary grain size of 10 to 50 nm was controlled to be 71% in number average. On the other hand, a dispersed material was prepared by replacing silver nitrate in Example A2 with chloroplatinate. The dispersed material was controlled by centrifugal separator such that platinum nanoparticles included 75% in number average of platinum nanoparticles having a primary grain size of 10 to 50 nm. That is, among the whole platinum nanoparticles constituting 100%, the proportion of the platinum nanoparticles having a primary grain size of 10 to 50 nm was controlled to be 75% in number average. Thus, a second dispersed material was obtained. Next, the first dispersed material of 95 weight % and the second dispersed material of 5 weight % were mixed. This dispersed material was defined as Example A6. Among 100 weight % of the dispersed material, final mixing ratio of the metal (sum of silver and platinum), water, ethanol, and solvent A were each controlled to be 50.0 weight %, 3.5 weight %, 2.5 weight %, and 44.0 weight %. The silver nanoparticles and the platinum nanoparticles in the dispersed material were chemically modified by the protective agent having an organic molecule main chain comprising a carbon backbone of carbon number of 3. The protective agent chemically modifying the silver nanoparticles and platinum nanoparticles contained hydroxyl group (—OH) and a carbonyl group (—C=O).

Example A7

A dispersed material which was subjected to replacement cleaning by ethanol in the same manner as in the Example A2 was controlled by centrifugal separator such that silver nanoparticles included 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. Thus, a first dispersed material was obtained. On the other hand, a dispersed material was prepared by replacing silver nitrate in Example A2 with palladium nitrate. After replacement cleaning by ethanol in the same manner as in the Example A2, the dispersed material was controlled by a centrifugal separator such that palladium nanoparticles included 72% in number average of palladium nanoparticles having a primary grain size of 10 to 50 nm. That is, among the whole palladium nanoparticles constituting 100%, the proportion of the palladium nanoparticles having a primary grain size of 10 to 50 nm was controlled to be 72% in number average. Thus, a second dispersed material was obtained. Next, the first dispersed material of 77 weight % and the second dispersed material of 23 weight % were mixed. This dispersed material was defined as Example A7.

Among 100 weight % of the dispersed material, the final mixing ratio of the metal (sum of silver and palladium), water, ethanol, and the solvent A were each controlled to be 50.0 weight %, 1.5 weight %, 2.0 weight %, and 46.0 weight %. The silver nanoparticles and the palladium nanoparticles in the dispersed material were chemically modified by the protective agent having a main chain of organic molecule comprising a carbon backbone of carbon number of 3. The protective agent chemically modifying the silver nanoparticles and palladium nanoparticles contained a hydroxyl group (—OH) and a carbonyl group (—C=O).

Example A8

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. Thus, a first dispersed material was obtained. On the other hand, a dispersed material was prepared by replacing silver nitrate in Example A2 with ruthenium trichloride. After replacement cleaning by ethanol in the same manner as in the Example A2, the dispersed material was controlled by centrifugal separator such that ruthenium nanoparticles included 72% in number average of ruthenium nanoparticles having a primary grain size of 10 to 50 nm. That is, among the whole ruthenium nanoparticles constituting 100%, proportion of the ruthenium nanoparticles having a primary grain size of 10 to 50 nm was controlled to be 72% in number average. Thus, a second dispersed material was obtained. Next, the first dispersed material of 76 weight % and the second dispersed material of 24 weight % were mixed. This dispersed material was defined as Example A8. Among 100 weight % of the dispersed material, the final (target) mixing ratio of the metal (sum of silver and ruthenium), water, ethanol, and the solvent A were each controlled to be 75.0 weight %, 1.5 weight %, 2.0 weight %, and 21.5 weight %. The silver nanoparticles and the ruthenium nanoparticles in the dispersed material were chemically modified by the protective agent having an organic molecule main chain comprising a carbon backbone of carbon number of 3. The protective agent chemically modifying the silver nanoparticles and ruthenium nanoparticles did not contain hydroxyl group (—OH) but contained a carbonyl group (—C=O).

Example A9

A dispersed material which was subjected to replacement cleaning by ethanol in the same manner as in the Example A2 was controlled by a centrifugal separator such that silver nanoparticles included 73% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 73% in number average. Thus, a first dispersed material was obtained. On the other hand, a dispersed material was prepared by replacing silver nitrate in Example A2 with nickel chloride. After replacement cleaning by ethanol in the same manner as in the Example A2, the dispersed material was controlled by a centrifugal separator such that nickel nanoparticles included 76% in number average of nickel nanoparticles having a primary grain size of 10 to 50 nm. That is, among the whole nickel nanoparticles constituting 100%, the proportion of the nickel nanoparticles having a primary grain size of 10 to 50 nm was controlled to be 76% in number average. Thus, a second dispersed material was obtained. Next, the first dispersed material of 76 weight % and the second dispersed material of 24 weight % were mixed. This dispersed material was defined as Example A9. Among 100 weight % of the dispersed material, the final mixing ratio of the metal (sum of silver and nickel), water, ethanol, and the solvent A were each controlled to be 75.0 weight %, 2.2 weight %, 2.0 weight %, and 20.8 weight %. The silver nanoparticles and the nickel nanoparticles in the dispersed material were chemically modified by the protective agent having an organic molecule main chain comprising a carbon backbone of carbon number of 3. The protective agent chemically modifying the silver nanoparticles and nickel nanoparticles did not contain hydroxyl group (—OH) but contained a carbonyl group (—C=O).

Example A 10

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. Thus, a first dispersed material was obtained. On the other hand, a dispersed material was prepared by replacing silver nitrate in Example A2 with cuprous nitrate (copper (I) nitrate). After replacement cleaning by ethanol in the same manner as in the Example A2, the dispersed material was controlled by a centrifugal separator such that copper nanoparticles included 72% in number average of copper nanoparticles having a primary grain size of 10 to 50 nm. That is, among the whole copper nanoparticles constituting 100%, the proportion of the copper nanoparticles having a primary grain size of 10 to 50 nm was controlled to be 72% in number average. Thus a second dispersed material was obtained. Next, the first dispersed material of 76 weight % and the second dispersed material of 24 weight % were mixed. This dispersed material was defined as Example A10. Among 100 weight % of the dispersed material, the final mixing ratio of the metal (sum of silver and copper), water, ethanol, and the solvent B were each controlled to be 75.0 weight %, 4.0 weight %, 5.0 weight %, and 16.0 weight %. The silver nanoparticles and the copper nanoparticles in the dispersed material were chemically modified by the protective agent having a main chain of organic molecule comprising a carbon backbone of carbon number of 3. The protective agent chemically modifying the silver nanoparticles and copper nanoparticles did not contain hydroxyl group (—OH) but contained a carbonyl group (—C=O).

Example A11

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. Thus, a first dispersed material was obtained. On the other hand, a dispersed material was prepared by replacing silver nitrate in Example A2 with tin dichloride. After replacement cleaning by ethanol in the same manner as in the Example A2, the dispersed material was controlled by a centrifugal separator such that tin nanoparticles included 72% in number average of tin nanoparticles having a primary grain size of 10 to 50 nm. That is, among the whole tin nanoparticles constituting 100%, the proportion of the tin nanoparticles having a primary grain size of 10 to 50 nm was controlled to be 72% in number average. Thus, a second dispersed material was obtained. Next, the first dispersed material of 76 weight % and the second dispersed material of 24 weight % were mixed. This dispersed material was defined as Example A11.

Among 100 weight % of the dispersed material, the final mixing ratio of the metal (sum of silver and tin), water, ethanol, and the solvent B were each controlled to be 75.0 weight %, 4.0 weight %, 5.0 weight %, and 16.0 weight %. The silver nanoparticles and the tin nanoparticles in the dispersed material were chemically modified by the protective agent having a main chain of organic molecule comprising a carbon backbone of carbon number of 3. The protective agent chemically modifying the silver nanoparticles and tin nanoparticles did not contain hydroxyl group (—OH) but contained a carbonyl group (—C=O).

Example A12

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. Thus a first dispersed material was obtained. On the other hand, a dispersed material was prepared by replacing silver nitrate in Example A2 with indium nitrate. After replacement cleaning by ethanol in the same manner as in the Example A2, the dispersed material was controlled by a centrifugal separator such that indium nanoparticles included 72% in number average of indium nanoparticles having a primary grain size of 10 to 50 nm. That is, among the whole indium nanoparticles constituting 100%, the proportion of the indium nanoparticles having a primary grain size of 10 to 50 nm was controlled to be 72% in number average. Thus, a second dispersed material was obtained. Next, the first dispersed material of 80 weight % and the second dispersed material of 20 weight % were mixed. This dispersed material was defined as Example A12.

Among 100 weight % of the dispersed material, the final (target) mixing ratio of the metal (sum of silver and indium), water, ethanol, and the solvent C were each controlled to be 75.0 weight %, 5.0 weight %, 5.0 weight %, and 15.0 weight %, where the solvent C denotes a mixed solution of toluene and hexane in a mixing ratio in weight ratio of 1:1 The silver nanoparticles and the indium nanoparticles in the dispersed material were chemically modified by the protective agent having a main chain of organic molecule comprising a carbon backbone of carbon number of 3. The protective agent chemically modifying the silver nanoparticles and indium nanoparticles did not contain hydroxyl group (—OH) but contained a carbonyl group (—C=O).

Example A13

A dispersed material which was subjected to replacement cleaning by ethanol in the same manner as in the Example A2 was controlled by a centrifugal separator such that silver nanoparticles included 74% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 74% in number average. Thus, a first dispersed material was obtained. On the other hand, a dispersed material was prepared by replacing silver nitrate in Example A2 with zinc chloride. After replacement cleaning by ethanol in the same manner as in the Example A2, the dispersed material was controlled by a centrifugal separator such that zinc nanoparticles included 74% in number average of zinc nanoparticles having a primary grain size of 10 to 50 nm. That is, among the whole zinc nanoparticles constituting 100%, the proportion of the zinc nanoparticles having a primary grain size of 10 to 50 nm was controlled to be 74% in number average. Thus, a second dispersed material was obtained. Next, the first dispersed material of 80 weight % and the second dispersed material of 20 weight % were mixed. This dispersed material was defined as Example A 13.

Among 100 weight % of the dispersed material, the final mixing ratio of the metal (sum of silver and zinc), water, and ethanol were each controlled to be 75.0 weight %, 10.0 weight %, and 15.0 weight %. The silver nanoparticles and the zinc nanoparticles in the dispersed material were chemically modified by the protective agent having a main chain of organic molecule comprising a carbon backbone of carbon number of 3. The protective agent chemically modifying the silver nanoparticles and zinc nanoparticles did not contain hydroxyl group (—OH) but contained a carbonyl group (—C=O).

Example A14

A dispersed material which was subjected to replacement cleaning by ethanol in the same manner as in the Example A2 was controlled by a centrifugal separator such that silver nanoparticles included 75% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 75% in number average. Thus a first dispersed material was obtained On the other hand, a dispersed material was prepared by replacing silver nitrate in Example A2 with chromium sulfate. After replacement cleaning by ethanol in the same manner as in the Example A2, the dispersed material was controlled by a centrifugal separator such that chromium nanoparticles included 75% in number average of chromium nanoparticles having a primary grain size of 10 to 50 nm. That is, among the whole chromium nanoparticles constituting 100%, the proportion of the chromium nanoparticles having a primary grain size of 10 to 50 nm was controlled to be 75% in number average. Thus a second dispersed material was obtained. Next, the first dispersed material of 95 weight % and the second dispersed material of 5 weight % were mixed. This dispersed material was defined as Example A14. Among 100 weight % of the dispersed material, final mixing ratio of the metal (sum of silver and chromium), water, and ethanol were each controlled to be 75.0 weight %, 5.0 weight %, and 20.0 weight %. The silver nanoparticles and the chromium nanoparticles in the dispersed material were chemically modified by the protective agent having a main chain of organic molecule comprising a carbon backbone of carbon number of 3. The protective agent chemically modifying the silver nanoparticles and chromium nanoparticles did not contain hydroxyl group (—OH) but contained a carbonyl group (—C=O).

Example A15

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 72% in number average. Thus a first dispersed material was obtained. On the other hand, a dispersed material was prepared by replacing silver nitrate in Example A2 with manganese sulfate. After replacement cleaning by ethanol in the same manner as in the Example A2, the dispersed material was controlled by a centrifugal separator such that manganese nanoparticles included 72% in number average of manganese nanoparticles having a primary grain size of 10 to 50 nm. That is, among the whole manganese nanoparticles constituting 100%, the proportion of the manganese nanoparticles having a primary grain size of 10 to 50 nm was controlled to be 72% in number average. Thus a second dispersed material was obtained. Next, the first dispersed material of 95 weight % and the second dispersed material of 5 weight % were mixed. This dispersed material was defined as Example A15. Among 100 weight % of the dispersed material, final mixing ratio of the metal (sum of silver and manganese), water, and ethanol were each controlled to be 75.0 weight %, 3.0 weight %, and 22.0 weight %. The silver nanoparticles and the manganese nanoparticles in the dispersed material were chemically modified by the protective agent having a main chain of organic molecule comprising a carbon backbone of carbon number of 3. The protective agent chemically modifying the silver nanoparticles and manganese nanoparticles did not contain hydroxyl group (—OH) but contained a carbonyl group (—C=O).

Example A16

The fluid dispersion obtained in the same manner as in the Example A1 was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning by ethylene glycol and ethanol. Thus, content of metal was controlled to be 50 weight %. After that, coarse particles were separated by a centrifugal separator. By controlling the centrifugal force of a centrifugal separator, silver nanoparticles were controlled to include 71% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 71% in number average. The dispersed material was defined as Example A16. Among 100 weight % of the dispersed material, the final mixing ratio of the metal (silver), water, and mixed agent of ethylene glycol and ethanol were each controlled to be 35.0 weight %, 2.0 weight %, 1.0 weight %, and 53.0 weight %. The silver nanoparticles in the dispersed material were chemically modified by the protective agent having a main chain of organic molecule comprising a carbon backbone of carbon number of 3. The protective agent chemically modifying the silver nanoparticles did not contain hydroxyl group (—OH) and a carbonyl group (—C=O).

Example A17

The fluid dispersion obtained in the same manner as in the Example A1 was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning by butanol. Thus, content of metal (silver) was controlled to be 50 weight %. After that, coarse particles were separated by a centrifugal separator. By controlling the centrifugal force of the centrifugal separator, silver nanoparticles were controlled to include 73% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 73% in number average. The dispersed material was defined as Example A17. Among 100 weight % of the dispersed material, the final mixing ratio of the metal (silver), water, butanol, and solvent A were each controlled to be 35.0 weight %, 1.5 weight %, 50.0 weight %, and 13.5 weight %. The silver nanoparticles in the dispersed material were chemically modified by the protective agent having a main chain of organic molecule comprising a carbon backbone of carbon number of 3. The protective agent chemically modifying the silver nanoparticles contained a hydroxyl group (—OH) but did not a contain carbonyl group (—C=O).

Example A18

The fluid dispersion obtained in the same manner as in the Example A1 was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning using propylene glycol and ethanol. Thus, content of metal (silver) was controlled to be 50 weight %. After that, coarse particles were separated by a centrifugal separator. By controlling the centrifugal force of the centrifugal separator, silver nanoparticles were controlled to include 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. The dispersed material was defined as Example A18. Among 100 weight % of the dispersed material, the final (target) mixing ratio of the metal (silver), water, propylene glycol, and ethanol were each controlled to be 35.0 weight %, 2.0 weight %, 1.0 weight %, and 62.0 weight %. The silver nanoparticles in the dispersed material were chemically modified by the protective agent having a main chain of organic molecule comprising a carbon backbone of carbon number of 3. The protective agent chemically modifying the silver nanoparticles contained hydroxyl group (—OH) but did not contain carbonyl group (—C=O).

Example A 19

The fluid dispersion was obtained in the same manner as in the Example A1 while replacing the sodium citrate with sodium maleate in the preparation of the aqueous solution of reducing agent. The fluid dispersion was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning by diethylene glycol and ethanol. Thus, content of metal (silver) was controlled to be 50 weight %. After that, coarse particles were separated by a centrifugal separator. By controlling the centrifugal force of the centrifugal separator, silver nanoparticles were controlled to include 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. The dispersed material was defined as Example A19.

Among 100 weight % of the dispersed material, the final (target) mixing ratio of the metal (silver), water, diethylene glycol and ethanol were each controlled to be 35.0 weight %, 5.0 weight %, 1.0 weight %, and 59.0 weight %. The silver nanoparticles in the dispersed material were chemically modified by the protective agent having a main chain of organic molecule comprising a carbon backbone of carbon number of 2. The protective agent chemically modifying the silver nanoparticles contained a hydroxyl group (—OH) and a carbonyl group (—C=O).

Example A20

The fluid dispersion was obtained in the same manner as in the Example A1 while replacing the sodium citrate with sodium malate in the preparation of the aqueous solution of reducing agent. The fluid dispersion was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning by glycol and ethanol. Thus, content of metal (silver) was controlled to be 50 weight %. After that, coarse particles were separated by a centrifugal separator. By controlling the centrifugal force of the centrifugal separator, silver nanoparticles were controlled to include 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. The dispersed material was defined as Example A20. Among 100 weight % of the dispersed material, final (target) mixing ratio of the metal (silver), water, glycerol and ethanol were each controlled to be 35.0 weight %, 35.0 weight %, 1.0 weight %, and 29.0 weight %. The silver nanoparticles in the dispersed material were chemically modified by the protective agent having a main chain of organic molecule comprising a carbon backbone of carbon number of 2. The protective agent chemically modifying the silver nanoparticles contained a hydroxyl group (—OH) and a carbonyl group (—C=O).

Example A21

The fluid dispersion was obtained in the same manner as in the Example A1 while replacing the sodium citrate with sodium glycolate in the preparation of the aqueous solution of reducing agent. The fluid dispersion was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning by diethylene glycol and ethanol. Thus, content of metal (silver) was controlled to be 50 weight %. After that, coarse particles were separated by a centrifugal separator. By controlling the centrifugal force of the centrifugal separator, silver nanoparticles were controlled to include 73% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 73% in number average. The dispersed material was defined as Example A21. Among 100 weight % of the dispersed material, final (target) mixing ratio of the metal (silver), water, and ethanol were each controlled to be 35.0 weight %, 10.0 weight %, and 55.0 weight %. The silver nanoparticles in the dispersed material were chemically modified by the protective agent having a main chain of organic molecule comprising a carbon backbone of carbon number of 1. The protective agent chemically modifying the silver nanoparticles did not contain a hydroxyl group (—OH) but contained a carbonyl group (—C=O).

Example A22

A fluid dispersion was obtained where the preparation of the aqueous solution of reducing agent was performed in the same manner as in the Example A1. The fluid dispersion was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning using erythritol and ethanol. Thus, content of metal (silver) was controlled to be 50 weight %. After that coarse particles were separated by a centrifugal separator. By controlling the centrifugal force of the centrifugal separator, silver nanoparticles were controlled to include 73% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 73% in number average. The dispersed material was defined as Example A22. Among 100 weight % of the dispersed material, the final (target) mixing ratio of the metal (silver), water, erythritol, ethanol, and solvent B were each controlled to be 35.0 weight %, 5.0 weight %, 1.0 weight %, 24.0 weight %, and 35.0 weight %. The silver nanoparticles in the dispersed material were chemically modified by the protective agent having a main chain of organic molecule comprising a carbon backbone of carbon number of 2. The protective agent chemically modifying the silver nanoparticles contained a hydroxyl group (—OH) and a carbonyl group (—C=O).

Example A23

The fluid dispersion was obtained in the same manner as in the Example A1 while replacing the sodium citrate with sodium malate in the preparation of the aqueous solution of reducing agent. The fluid dispersion was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning by isobonyl hexanol and ethanol. Thus, content of metal (silver) was controlled to be 50 weight %. After that, coarse particles were separated by a centrifugal separator. By controlling the centrifugal force of the centrifugal separator, silver nanoparticles were controlled to include 75% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 75% in number average. The dispersed material was defined as Example A23. Among 100 weight % of the dispersed material, final (target) mixing ratio of the metal (silver), water, isobonyl hexanol, and ethanol were each controlled to be 35.0 weight %, 1.0 weight %, 1.0 weight %, and 63.0 weight %. The silver nanoparticles in the dispersed material were chemically modified by the protective agent having a main chain of organic molecule comprising a carbon backbone of carbon number of 2. The protective agent chemically modifying the silver nanoparticles contained a hydroxyl group (—OH) and a carbonyl group (—C=O).

Example A24

The fluid dispersion was obtained in the same manner as in the Example A1 while replacing the sodium citrate with sodium malate in the preparation of the aqueous solution of reducing agent. The fluid dispersion was left at room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning using methanol. Thus, content of metal (silver) was controlled to be 50 weight %. After that, coarse particles were separated by a centrifugal separator. By controlling the centrifugal force of the centrifugal separator, silver nanoparticles were controlled to include 75% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 75% in number average. The dispersed material was defined as Example A24.

Among 100 weight % of the dispersed material, the final (target) mixing ratio of the metal (silver), water, and methanol were each controlled to be 35.0 weight %, 30.0 weight %, and 35.0 weight %. The silver nanoparticles in the dispersed material were chemically modified by the protective agent having an organic molecule main chain comprising a carbon backbone of carbon number of 2. The protective agent chemically modifying the solver nanoparticles contained a hydroxyl group (—OH) and a carbonyl group (—C=O).

Example A25

The dispersed material which was subjected to replacement cleaning by ethanol in the same manner as in the Example A2 was controlled by centrifugal separator such that silver nanoparticles included 71% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 71% in number average. Thus a first dispersed material was obtained. On the other hand, dispersed material was prepared by replacing the silver nitrate in Example A2 with nickel chloride. After replacement cleaning using ethanol in the same manner as in the Example A2, the dispersed material was controlled by centrifugal separator such that nickel nanoparticles included 71% in number average of nickel nanoparticles having a primary grain size of 10 to 50 nm. That is, among the whole nickel nanoparticles constituting 100%, proportion of the nickel nanoparticles having a primary grain size of 10 to 50 nm was controlled to be 71% in number average. Thus, a second dispersed material was obtained. Next, the first dispersed material of 98 weight % and the second dispersed material of 2 weight % were mixed. This dispersed material was defined as Example A25.

Among 100 weight % of the dispersed material, final (target) mixing ratio of the metal (sum of silver and nickel), water, and ethanol were each controlled to be 35.0 weight %, 5.0 weight %, and 60.0 weight %. The silver nanoparticles and the nickel nanoparticles in the dispersed material were chemically modified by the protective agent having a main chain of organic molecule comprising a carbon backbone of carbon number of 3. The protective agent chemically modifying the silver nanoparticles and nickel nanoparticles contained a hydroxyl group (—OH) and a carbonyl group (—C=O).

Example A26

A dispersed material which was subjected to replacement cleaning by ethanol in the same manner as in the Example A2 was controlled by a centrifugal separator such that silver nanoparticles included 71% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 71% in number average. Thus, a first dispersed material was obtained. On the other hand, a dispersed material was prepared by replacing the silver nitrate in Example A2 with cuprous nitrate. After replacement cleaning using ethanol in the same manner as in the Example A2, the dispersed material was controlled by a centrifugal separator such that copper nanoparticles included 71% in number average of copper nanoparticles having a primary grain size of 10 to 50 nm. That is, among the whole copper nanoparticles constituting 100%, the proportion of the copper nanoparticles having a primary grain size of 10 to 50 nm was controlled to be 71% in number average. Thus, a second dispersed material was obtained. Next, the first dispersed material of 98 weight % and the second dispersed material of 2 weight % were mixed. This dispersed material was defined as Example A26.

Among 100 weight % of the dispersed material, final (target) mixing ratio of the metal (sum of silver and copper), water, and ethanol were each controlled to be 35.0 weight %, 5.0 weight %, and 60.0 weight %. The silver nanoparticles and the copper nanoparticles in the dispersed material were chemically modified by the protective agent having a main chain of organic molecule comprising a carbon backbone of carbon number of 3. The protective agent chemically modifying the silver nanoparticles and copper nanoparticles contained a hydroxyl group (—OH) and a carbonyl group (—C=O).

Example A27

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 72% in number average. Thus, a first dispersed material was obtained. On the other hand, a dispersed material was prepared by replacing the silver nitrate in Example A2 with tin dichloride. After replacement cleaning by ethanol in the same manner as in the Example A2, the dispersed material was controlled by a centrifugal separator such that tin nanoparticles included 72% in number average of tin nanoparticles having a primary grain size of 10 to 50 nm. That is, among the whole tin nanoparticles constituting 100%, the proportion of the tin nanoparticles having a primary grain size of 10 to 50 nm was controlled to be 72% in number average. Thus, a second dispersed material was obtained. Next, the first dispersed material of 98 weight % and the second dispersed material of 2 weight % were mixed. This dispersed material was defined as Example A27.

Among 100 weight % of the dispersed material, the final mixing ratio of the metal (sum of silver and tin), water, and ethanol were each controlled to be 35.0 weight %, 2.0 weight %, and 63.0 weight %. The silver nanoparticles and the tin nanoparticles in the dispersed material were chemically modified by the protective agent having a main chain of organic molecule comprising a carbon backbone of carbon number of 3. The protective agent chemically modifying the silver nanoparticles and tin nanoparticles contained a hydroxyl group (—OH) and a carbonyl group (—C=O).

Example A28

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 72% in number average. Thus a first dispersed material was obtained. On the other hand, dispersed material was prepared by replacing the silver nitrate in Example A2 by zinc chloride. After replacement cleaning by ethanol in the same manner as in the Example A2, the dispersed material was controlled by a centrifugal separator such that zinc nanoparticles included 72% in number average of zinc nanoparticles having a primary grain size of 10 to 50 nm. That is, among the whole zinc nanoparticles constituting 100%, the proportion of the zinc nanoparticles having a primary grain size of 10 to 50 nm was controlled to be 72% in number average. Thus a second dispersed material was obtained. Next, the first dispersed material of 98 weight % and the second dispersed material of 2 weight % were mixed. This dispersed material was defined as Example A28.

Among 100 weight % of the dispersed material, the final (target) mixing ratio of the metal (sum of silver and zinc), water, and methanol were each controlled to be 35.0 weight %, 2.0 weight %, and 63.0 weight %. The silver nanoparticles and the zinc nanoparticles in the dispersed material were chemically modified by the protective agent having a main chain of organic molecule comprising a carbon backbone of carbon number of 3. The protective agent chemically modifying the silver nanoparticles and zinc nanoparticles contained a hydroxyl group (—OH) and a carbonyl group (—C=O).

Example A28

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 72% in number average. Thus a first dispersed material was obtained. On the other hand, a dispersed material was prepared by replacing the silver nitrate in Example A2 with chromium sulfate. After replacement cleaning using ethanol in the same manner as in the Example A2, the dispersed material was controlled by a centrifugal separator such that chromium nanoparticles included 72% in number average of chromium nanoparticles having a primary grain size of 10 to 50 nm. That is, among the whole chromium nanoparticles constituting 100%, the proportion of the chromium nanoparticles having a primary grain size of 10 to 50 nm was controlled to be 72% in number average. Thus, a second dispersed material was obtained. Next, the first dispersed material of 99 weight % and the second dispersed material of 1 weight % were mixed. This dispersed material was defined as Example A29.

Among 100 weight % of the dispersed material, final (target) mixing ratio of the metal (sum of silver and chromium), water, and ethanol were each controlled to be 35.0 weight %, 2.0 weight %, and 63.0 weight %. The silver nanoparticles and the chromium nanoparticles in the dispersed material were chemically modified by the protective agent having a main chain of organic molecule comprising a carbon backbone of carbon number of 3. The protective agent chemically modifying the silver nanoparticles and chromium nanoparticles contained a hydroxyl group (—OH) and a carbonyl group (—C=O).

Example A30

A dispersed material which was subjected to replacement cleaning by ethanol in the same manner as in the Example A2 was controlled by a centrifugal separator such that silver nanoparticles included 72% in number average of silver nanoparticles having a primary grain size of 10 to 50 nm. That is, among the whole silver nanoparticles constituting 100%, proportion of the silver nanoparticles having a primary grain size of 10 to 50 nm was controlled to be 72% in number average. Thus, a first dispersed material was obtained. On the other hand, a dispersed material was prepared by replacing the silver nitrate in Example A2 with manganese sulfate. After replacement cleaning by ethanol in the same manner as in the Example A2, the dispersed material was controlled by a centrifugal separator such that manganese nanoparticles included 72% in number average of manganese nanoparticles having a primary grain size of 10 to 50 nm. That is, among the whole manganese nanoparticles constituting 100%, the proportion of the manganese nanoparticles having a primary grain size of 10 to 50 nm was controlled to be 72% in number average. Thus, a second dispersed material was obtained. Next, the first dispersed material of 99 weight % and the second dispersed material of 1 weight % were mixed. This dispersed material was defined as Example A30.

Among 100 weight % of the dispersed material, final (target) mixing ratio of the metal (sum of silver and manganese), water, and ethanol were each controlled to be 35.0 weight %, 2.0 weight %, and 63.0 weight %. The silver nanoparticles and the manganese nanoparticles in the dispersed material were chemically modified by the protective agent having a main chain of organic molecule comprising a carbon backbone of carbon number of 3. The protective agent chemically modifying the silver nanoparticles and manganese nanoparticles contained a hydroxyl group (—OH) and a carbonyl group (—C=O).

Example A31

A dispersed material which was subjected to replacement cleaning by methanol in the same manner as in the Example A1 was controlled by a centrifugal separator such that silver nanoparticles included 100% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 100% in number average. This dispersed material was defined as Example A31. Among 100 weight % of the dispersed material, the final (target) mixing ratio of the metal (silver), water, and methanol were each controlled to be 3.5 weight %, 1.0 weight %, and 95.5 weight %. The silver nanoparticles in the dispersed material were chemically modified by the protective agent having a main chain of organic molecule comprising a carbon backbone of carbon number of 3. The protective agent chemically modifying the silver nanoparticles contained hydroxyl group (—OH) and carbonyl group (—C=O).

Example A32

The dispersed material which was subjected to replacement cleaning by methanol in the same manner as in the Example A1 was controlled by centrifugal separator such that silver nanoparticles included 100% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 100% in number average. This dispersed material was defined as Example A32. Among 100 weight % of the dispersed material, the final (target) mixing ratio of the metal (silver), water, and methanol were each controlled to be 90.0 weight %, 9.8 weight %, and 0.2 weight %. The silver nanoparticles in the dispersed material were chemically modified by the protective agent having a main chain of organic molecule comprising a carbon backbone of carbon number of 3. The protective agent chemically modifying the silver nanoparticles contained a hydroxyl group (—OH) and a carbonyl group (—C=O).

Comparative Example A1

A dispersed material which was subjected to replacement cleaning by methanol was controlled by a centrifugal separator such that silver nanoparticles included 68% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 68% in number average. Among 100 weight % of the dispersed material, final (target) mixing ratio of the metal (silver), water, and methanol were each controlled to be 50.0 weight %, 2.5 weight %, and 47.5 weight %. The other preparation conditions were the same as those in Example A1. The thus obtained dispersed material was defined as Comparative Example A1.

Comparative Example A2

A dispersed material was prepared by replacing the sodium citrate by sodium mevalonate in the preparation of the aqueous solution of reducing agent. Among 100 weight % of the dispersed material, final mixing ratio of the metal (silver), water, and ethanol were each controlled to be 50.0 weight %, 4.0 weight %, and 46.0 weight %. The other preparation conditions were the same as those in Example A2. The thus obtained dispersed material was defined as Comparative Example A2. The silver nanoparticles in the dispersed material were chemically modified by the protective agent having a main chain of organic molecule comprising a carbon backbone of carbon number of 4.

Comparative Example A3

A dispersed material was prepared such that final mixing ratio of the metal (silver), water, ethanol, and solvent A were each controlled to be 50.0 weight %, 0.7 weight %, 30.0 weight %, and 19.3 weight % among 100 weight % of the dispersed material. The other preparation conditions were the same as those of Example A3. The thus obtained dispersed material was defined as Comparative Example A3.

Comparative Example A4

A dispersed material was prepared such that final mixing ratio of the metal (silver), water, ethanol, and solvent B were each controlled to be 50.0 weight %, 40.0 weight %, 1.0 weight %, and 9.0 weight % among 100 weight % of the dispersed material. The other preparation conditions were the same as those of Example A4. The thus obtained dispersed material was defined as Comparative Example A4.

Comparative Example A5

A dispersed material was prepared using propanol in replacement cleaning. Among 100 weight % of the dispersed material, the final mixing ratio of the metal (silver), water, propanol, and solvent C were each controlled to be 50.0 weight %, 3.5 weight %, 30.0 weight %, and 16.5 weight %. The other preparation conditions were the same as those in Example A5. The thus obtained dispersed material was defined as Comparative Example A5.

Comparative Example A6

A dispersed material was prepared in the same manner as in Example A6, while the first dispersed material of 74 weight % and the second dispersed material of 25 weight % were mixed, and final mixing ratio of the metal (silver and platinum), water, and ethanol were each controlled to be 75.0 weight %, 3.5 weight %, and 21.5 weight % among 100 weight % of the dispersed material. The thus obtained dispersed material was defined as Comparative Example A6.

Comparative Example A7

A dispersed material was prepared in the same manner as in Example A7, while the first dispersed material of 73 weight % and the second dispersed material of 27 weight % were mixed, and the final mixing ratio of the metal (silver and palladium), water, and ethanol were each controlled to be 75.0 weight %, 2.2 weight %, and 22.8 weight % among 100 weight % of the dispersed material. The thus obtained dispersed material was defined as Comparative Example A7.

Comparative Example A8

A dispersed material was prepared in the same manner as in Example A8, while the first dispersed material of 74 weight % and the second dispersed material of 26 weight % were mixed, and the final mixing ratio of the metal (silver and ruthenium), water, and ethanol were each controlled to be 75.0 weight %, 15.0 weight %, and 10.0 weight % among 100 weight % of the dispersed material. The thus obtained dispersed material was defined as Comparative Example A8.

Comparative Example A9

A dispersed material was prepared in the same manner as in Example A9, while the first dispersed material of 74 weight % and the second dispersed material of 26 weight % were mixed, and the final mixing ratio of the metal (silver and nickel), water, and ethanol and solvent B were each controlled to be 75.0 weight %, 2.2 weight %, 12.8 weight %, and 10.0 weight % among 100 weight % of the dispersed material. The thus obtained dispersed material was defined as Comparative Example A9.

Comparative Example A 10

A dispersed material was prepared in the same manner as in Example A10, while the first dispersed material of 72 weight % and the second dispersed material of 28 weight % were mixed, and the final mixing ratio of the metal (silver and copper), water, ethanol, and solvent C were each controlled to be 75.0 weight %, 4.0 weight %, 11.0 weight %, and 10.0 weight % among 100 weight % of the dispersed material. The thus obtained dispersed material was defined as Comparative Example A10.

Comparative Example A11

A dispersed material was prepared in the same manner as in Example A11, while the first dispersed material of 73 weight % and the second dispersed material of 27 weight % were mixed, and the final mixing ratio of the metal (silver and tin), water, and methanol were each controlled to be 35.0 weight %, 4.0 weight %, and 61.0 weight % among 100 weight % of the dispersed material. The thus obtained dispersed material was defined as Comparative Example A11.

Comparative Example A12

A dispersed material was prepared in the same manner as in Example A12, while the first dispersed material of 74 weight % and the second dispersed material of 26 weight % were mixed, and the final mixing ratio of the metal (silver and indium), water, and ethanol were each controlled to be 35.0 weight %, 30.0 weight %, and 35.0 weight % among 100 weight % of the dispersed material. The thus obtained dispersed material was defined as Comparative Example A12.

Comparative Example A13

A dispersed material was prepared in the same manner as in Example A13, while the first dispersed material of 74 weight % and the second dispersed material of 26 weight % were mixed, and the final mixing ratio of the metal (silver and zinc), water, ethanol, and solvent A were each controlled to be 35.0 weight %, 10.0 weight %, 20.0 weight %, and 35.0 weight % among 100 weight % of the dispersed material. The thus obtained dispersed material was defined as Comparative Example A13.

Comparative Example A14

A dispersed material was prepared in the same manner as in Example A14, while the first dispersed material of 73 weight % and the second dispersed material of 27 weight % were mixed, and the final mixing ratio of the metal (silver and chromium), water, ethanol, and solvent B were each controlled to be 35.0 weight %, 5.0 weight %, 20.0 weight %, and 40.0 weight % among 100 weight % of the dispersed material. The thus obtained dispersed material was defined as Comparative Example A14.

Comparative Example A15

A dispersed material was prepared in the same manner as in Example A13, while the first dispersed material of 74 weight % and the second dispersed material of 26 weight % were mixed, and the final mixing ratio of the metal (silver and manganese), water, ethanol, and solvent C were each controlled to be 35.0 weight %, 3.0 weight %, 20.0 weight %, and 42.0 weight % among 100 weight % of the dispersed material. The thus obtained dispersed material was defined as Comparative Example A15.

Comparative Test 1 and Evaluation

Each of the dispersed materials of Examples A1 to A32 and Comparative Examples A1 to A15 were coated on a base material such that the coated film after the baking had a film thickness shown below in Table 3 and Table 4. After coating, the base materials were baked at a temperature shown below in Table 3 and Table 4. Thus, an electrode was formed on each of the base materials. As the base materials, a solar cell coated with an ITO film, a solar cell that is not coated with an ITO film, a silicon substrate, a glass plate, a polyimide plate, a glass plate coated with a PET film or an ITO film were used. Reflectance and electric conductivity of the electrode formed on each base material were measured before subjecting the base material having the electrode to a weathering test. Reflectance and electric conductivity of the electrode formed on each base material were also measured after a weathering test. The results are shown in Table 3 and 4.

The weathering test was performed by storing the base material formed with the electrode for 1000 hours in a thermo-hygrostat while retaining the temperature of 100° C. and the humidity of 50%.

In the measurement of the reflectance, electromagnetic wave having a wavelength of 750 to 1500 nm (infrared ray and visible ray) was irradiated on the electrode, and the reflected electromagnetic wave was measured using an UV-visible spectrophotometer (V-570: JASCO Corporation), and the proportion of reflection to total irradiation was calculated. Primary grain sizes of metal nanoparticles were measured using a FE-TEM (Field Emission type Transmission Electron Microscope: JEOL Ltd.). The proportion of silver nanoparticles having a primary grain size of 10 to 50 nm was evaluated by taking a photograph of the primary grains of metal nanoparticles using the FE-TEM and measuring the counts of each grain size by image analysis of the photograph. The electric conductivity was determined as a volume resistivity ($\Omega \cdot cm$) calculated from a result of a measurement by a four-probe method. Firstly, the thickness of the electrode after the baking was directly measured from a cross section of the electrode using a SEM (Electron Microscope 5800: Hitachi, Ltd.). Next, the observed thickness of the electrode was inputted in a Four-Probe type Resistivity Meter (Loresta: Mitsubishi Chemical Corporation), and the volume resistivity of the electrode was measured.

Absence or existence of the hydroxyl group (—OH) and carbonyl group (—C=O) was confirmed by instrumental analysis using XPS (X-ray photoelectron spectroscope: Quantum 2000 of PHI Inc.), TOF-SIMS (Time-of-flight secondary ion mass spectrometer: TOF-SIMS IV of ION-TOF GmbH), FTIR (Fourier Transform Infrared Spectroscope; NEXUS 670 of Nicolet Instruments Corporation), and TPD-MS (Temperature Programmed Desorption Mass Spectroscope: 5973N of Agilent Technologies).

Table 1 and Table 2 showed properties of each of dispersed materials of Examples A1 to A32 and Comparative Example A1 to A15. The properties include a proportion of metal nanoparticles having a primary grain size of 10 to 50 nm, a carbon number of organic molecule main chain, absence or existence of a hydroxyl group (—OH), absence or existence of carbonyl group (—C═O), species and mixing ratio of dispersed material (composition), species and content (content of hetero-metal among 100 weight % as a sum of the silver content and content of metal other than silver) of hetero-metal (metal other than silver). The reflectance, the electric conductivity (volume resistivity), the weathering resistance, the species of the base material, the film thickness, and the baking temperature were shown in Table 3 and Table 4. In the columns of weathering resistance in Table 3 and Table 4, "Good" denotes a case where the reflectance was 80% or more and the resistivity was less than $20 \times 10^{-6} \Omega \cdot cm$, "NG (Not good)" denotes any of a case where the reflectance was less than 80%, a case where the reflectance was less than 80% and the resistivity was more than $20 \times 10^{-6} \Omega \cdot cm$, a case where the reflectance was 80% or more and the volume resistivity was more than $20 \times 10^{-6} \Omega \cdot cm$, or a case where the reflectance was less than 80% and the resistivity was more than $20 \times 10^{-6} \Omega \cdot cm$. In the column of alcohol group in Table 1, "ME" denotes methanol, "ET" denotes ethanol, "EG" denotes ethylene glycol, "BU" denotes butanol, "PG" denotes propylene glycol, "DEG" denotes diethylene glycol, GL denotes glycerol, "IH" denotes isobonyl-hexanol, and "PR" denotes propanol.

In the columns of the other solvent, "A" denotes a mixed solution of acetone and isopropyl-glycol in a mixing ratio in weight ratio of 1:1, "B" denotes a mixed solution of cyclohexane and methyl ethyl ketone in a mixing ratio in weight ratio of 1:1, and "C" denotes a mixed solution of toluene and hexane in a mixing ratio in weight ratio of 1:1.

TABLE 1

| | Proportion of metal nanoparticles having an average grain size of 10 to 50 nm | Carbon number of organic molecule main chain | Protective Agent —OH | —C═O | Metal | Water | Alcohol group | Other solvent | Hetero metal species: wt. % |
|---|---|---|---|---|---|---|---|---|---|
| Ex. A1 | 71 | 3 | Absent | Exist | 50.0 | 2.5 | ME: 5.0 | A: 42.5 | Absent |
| Ex. A2 | 72 | 3 | Absent | Exist | 50.0 | 4.0 | ET: 5.0 | A: 41.0 | Absent |
| Ex. A3 | 73 | 3 | Absent | Exist | 50.0 | 1.0 | ET: 5.0 | B: 44.0 | Absent |
| Ex. A4 | 75 | 3 | Absent | Exist | 50.0 | 48.0 | ET: 2.0 | Absent | Absent |
| Ex. A5 | 75 | 3 | Absent | Exist | 50.0 | 3.5 | ET: 46.5 | Absent | Au: 5 |
| Ex. A6 | 71 | 3 | Exist | Exist | 50.0 | 3.5 | ET: 2.5 | A: 44.0 | Pt: 5 |
| Ex. A7 | 72 | 3 | Exist | Exist | 50.0 | 1.5 | ET: 2.5 | A: 46.0 | Pd: 23 |
| Ex. A8 | 72 | 3 | Absent | Exist | 75.0 | 1.5 | ET: 2.0 | A: 21.5 | Ru: 24 |
| Ex. A9 | 73 | 3 | Absent | Exist | 75.0 | 2.2 | ET: 2.0 | A: 20.8 | Ni: 24 |
| Ex. A10 | 72 | 3 | Absent | Exist | 75.0 | 4.0 | ET: 5.0 | B: 16.0 | Cu: 24 |
| Ex. A11 | 72 | 3 | Absent | Exist | 75.0 | 4.0 | ET: 5.0 | B: 16.0 | Sn: 24 |
| Ex. A12 | 72 | 3 | Absent | Exist | 75.0 | 5.0 | ET: 5.0 | C: 15.0 | In: 20 |
| Ex. A13 | 74 | 3 | Absent | Exist | 75.0 | 10.0 | ET: 15.0 | Absent | Zn: 20 |
| Ex. A14 | 75 | 3 | Absent | Exist | 75.0 | 5.0 | ET: 20.0 | Absent | Cr: 5 |
| Ex. A15 | 72 | 3 | Absent | Exist | 75.0 | 3.0 | ET: 22.0 | Absent | Mn: 5 |
| Ex. A16 | 71 | 3 | Absent | Absent | 35.0 | 2.0 | EG: 10.0, ET: 53.0 | Absent | Absent |
| Ex. A17 | 73 | 3 | Exist | Absent | 35.0 | 1.5 | BU: 50.0 | A: 13.5 | Absent |
| Ex. A18 | 72 | 3 | Exist | Absent | 35.0 | 2.0 | PG: 1.0, ET: 62.0 | Absent | Absent |
| Ex. A19 | 72 | 2 | Exist | Exist | 35.0 | 5.0 | DEG: 1.0, ET: 59.0 | Absent | Absent |
| Ex. A20 | 72 | 2 | Exist | Exist | 35.0 | 35.0 | GL: 1.0, ET: 29.0 | Absent | Absent |
| Ex. A21 | 73 | 1 | Absent | Exist | 35.0 | 10.0 | ET: 55.0 | Absent | Absent |
| Ex. A22 | 73 | 2 | Exist | Exist | 35.0 | 5.0 | ER: 1.0, ET: 24.0 | B: 35.0 | Absent |
| Ex. A23 | 75 | 2 | Exist | Exist | 35.0 | 1.0 | IH: 1.0, ET: 63.0 | Absent | Absent |

TABLE 2

| | Proportion of metal nanoparticles having an average grain size of 10 to 50 nm | Carbon number of organic molecule main chain | Protective agent —OH | —C═O | Metal | Water | Alcohol | Other solvent | Hetero metal species: wt. % |
|---|---|---|---|---|---|---|---|---|---|
| Ex. A24 | 75 | 2 | Exist | Exist | 35.0 | 30.0 | ME: 35.0 | Absent | Absent |
| Ex. A25 | 71 | 3 | Exist | Exist | 35.0 | 5.0 | ET: 60.0 | Absent | Ni: 2 |
| Ex. A26 | 71 | 3 | Exist | Exist | 35.0 | 2.0 | ET: 60.0 | Absent | Cu: 2 |
| Ex. A27 | 72 | 3 | Exist | Exist | 35.0 | 2.0 | ET: 63.0 | Absent | Sn: 2 |
| Ex. A28 | 72 | 3 | Exist | Exist | 35.0 | 2.0 | ET: 63.0 | Absent | Zn: 2 |
| Ex. A29 | 72 | 3 | Exist | Exist | 35.0 | 2.0 | ET: 63.0 | Absent | Cr: 1 |
| Ex. A30 | 72 | 3 | Exist | Exist | 35.0 | 2.0 | ET: 63.0 | Absent | Mn: 1 |
| Ex. A31 | 100 | 3 | Exist | Exist | 3.5 | 1.0 | ME: 95.5 | Absent | Absent |
| Ex. A32 | 100 | 3 | Exist | Exist | 90.0 | 9.8 | ME: 0.2 | Absent | Absent |
| Comparative A1 | 68 | 3 | Exist | Absent | 50.0 | 2.5 | ME: 47.5 | Absent | Absent |
| Comparative A2 | 72 | 4 | Exist | Absent | 50.0 | 4.0 | ET: 46.0 | Absent | Absent |
| Comparative A3 | 73 | 3 | Exist | Absent | 50.0 | 0.7 | ET: 30.0 | A: 19.3 | Absent |
| Comparative A4 | 75 | 3 | Exist | Exist | 50.0 | 40.0 | ET: 1.0 | B: 9.0 | Absent |
| Comparative A5 | 75 | 3 | Exist | Exist | 50.0 | 3.5 | PR: 30.0 | C: 16.5 | Au: 27 |
| Comparative A6 | 71 | 3 | Exist | Exist | 75.0 | 3.5 | ET: 21.5 | Absent | Pt: 26 |

TABLE 2-continued

| | Protective agent | | | | Dispersed material (composition) wt. % | | | | Hetero metal |
|---|---|---|---|---|---|---|---|---|---|
| | Proportion of metal nanoparticles having an average grain size of 10 to 50 nm | Carbon number of organic molecule main chain | —OH | —C═O | Metal | Water | Alcohol | Other solvent | species: wt. % |
| Comparative A7 | 72 | 3 | Exist | Exist | 75.0 | 2.2 | ET: 22.8 | Absent | Pd: 27 |
| Comparative A8 | 72 | 3 | Absent | Exist | 75.0 | Absent | ET: 15.0 | A: 10.0 | Ru: 26 |
| Comparative A9 | 73 | 3 | Absent | Exist | 75.0 | 2.2 | ET: 12.8 | B: 10.0 | Ni: 26 |
| Comparative A10 | 72 | 3 | Absent | Exist | 75.0 | 4.0 | ET: 11.0 | C: 10.0 | Cu: 28 |
| Comparative A11 | 72 | 3 | Absent | Exist | 35.0 | 4.0 | ME: 61.0 | Absent | Sn: 27 |
| Comparative A12 | 72 | 3 | Absent | Exist | 35.0 | 30.0 | ME: 35.0 | Absent | In: 26 |
| Comparative A13 | 74 | 3 | Absent | Exist | 35.0 | 10.0 | ME: 20.0 | A: 35.0 | Zn: 26 |
| Comparative A14 | 75 | 3 | Absent | Exist | 35.0 | 5.0 | ME: 20.0 | B: 40.0 | Cr: 27 |
| Comparative A15 | 72 | 3 | Absent | Exist | 35.0 | 3.0 | M2: 20.0 | C: 42.0 | Mn: 26 |

TABLE 3

| | Base material | Coating method | Film thickness (μm) | Baking temperature (° C.) | Before testing weathering resistance | | Weathering resistance |
|---|---|---|---|---|---|---|---|
| | | | | | Reflectance | Volume Resistivity | |
| Ex. A1 | Solar cell with ITO film | Knife coating | 1.9 | 150 | 95 | $3 \times 10^{-6}$ | Good |
| Ex. A2 | Solar cell with ITO film | Knife coating | 1.9 | 150 | 93 | $3 \times 10^{-6}$ | Good |
| Ex. A3 | Solar cell with ITO film | Ink-jet coating | 1.8 | 200 | 96 | $2 \times 10^{-6}$ | Good |
| Ex. A4 | Solar cell with ITO film | die coating | 1.8 | 200 | 97 | $2 \times 10^{-6}$ | Good |
| Ex. A5 | Solar cell without ITO film | Knife coating | 1.9 | 200 | 91 | $2 \times 10^{-6}$ | Good |
| Ex. A6 | Solar cell without ITO film | Knife coating | 1.9 | 200 | 90 | $2 \times 10^{-6}$ | Good |
| Ex. A7 | Solar cell without ITO film | Knife coating | 1.8 | 200 | 90 | $4 \times 10^{-6}$ | Good |
| Ex. A8 | Solar cell without ITO film | Dispenser coating | 1.7 | 200 | 92 | $4 \times 10^{-6}$ | Good |
| Ex. A9 | Silicon substrate | Dispenser coating | 1.7 | 200 | 90 | $5 \times 10^{-6}$ | Good |
| Ex. A10 | Silicon substrate | Dispenser coating | 1.5 | 200 | 91 | $5 \times 10^{-6}$ | Good |
| Ex. A11 | Silicon substrate | Off-set printing | 1.5 | 200 | 91 | $4 \times 10^{-6}$ | Good |
| Ex. A12 | Glass plate | Dispenser coating | 1.0 | 200 | 91 | $4 \times 10^{-6}$ | Good |
| Ex. A13 | Glass plate | Dispenser coating | 1.0 | 200 | 92 | $4 \times 10^{-6}$ | Good |
| Ex. A14 | Glass plate | Dispenser coating | 1.0 | 200 | 90 | $4 \times 10^{-6}$ | Good |
| Ex. A15 | Glass plate | Dispenser coating | 1.0 | 150 | 90 | $3 \times 10^{-6}$ | Good |
| Ex. A16 | Glass plate | Spray coating | 0.2 | 150 | 90 | $3 \times 10^{-6}$ | Good |
| Ex. A17 | Glass plate | Spray coating | 0.4 | 150 | 90 | $3 \times 10^{-6}$ | Good |
| Ex. A18 | Glass plate | Spray coating | 0.4 | 150 | 90 | $3 \times 10^{-6}$ | Good |
| Ex. A19 | Solar cell with ITO film | Spray coating | 0.4 | 180 | 95 | $2 \times 10^{-6}$ | Good |
| Ex. A20 | Solar cell with ITO film | Spray coating | 0.4 | 180 | 97 | $2 \times 10^{-6}$ | Good |
| Ex. A21 | Solar cell with ITO film | Spray coating | 0.4 | 180 | 94 | $2 \times 10^{-6}$ | Good |
| Ex. A22 | Solar cell with ITO film | Spray coating | 0.3 | 180 | 96 | $2 \times 10^{-6}$ | Good |
| Ex. A23 | Solar cell without ITO film | Spray coating | 0.3 | 180 | 95 | $3 \times 10^{-6}$ | Good |

TABLE 4

| | Base material | Coating method | Film thickness (μm) | Baking temperature (° C.) | Before testing weathering resistance | | Weathering resistance |
|---|---|---|---|---|---|---|---|
| | | | | | Reflectance | Volume Resistivity (Ω · cm) | |
| Ex. A24 | Solar cell without ITO film | Spray coating | 0.3 | 180 | 95 | $3 \times 10^{-6}$ | Good |
| Ex. A25 | Polyimide plate | Spray coating | 0.3 | 200 | 90 | $4 \times 10^{-6}$ | Good |
| Ex. A26 | Polyimide plate | Spray coating | 0.3 | 200 | 90 | $5 \times 10^{-6}$ | Good |
| Ex. A27 | Polyimide plate | Spray coating | 0.3 | 200 | 91 | $5 \times 10^{-6}$ | Good |
| Ex. A28 | PET film | Spray coating | 0.3 | 200 | 91 | $4 \times 10^{-6}$ | Good |
| Ex. A29 | PET film | Spray coating | 0.3 | 200 | 90 | $4 \times 10^{-6}$ | Good |
| Ex. A30 | PET film | Spray coating | 0.3 | 200 | 91 | $4 \times 10^{-6}$ | Good |
| Ex. A31 | Solar cell with ITO film | Spin coating | 0.3 | 180 | 95 | $3 \times 10^{-6}$ | Good |
| Ex. A32 | Solar cell with ITO film | Screen printing | 2.0 | 180 | 93 | $3 \times 10^{-6}$ | Good |
| Comparative A1 | Solar cell with ITO film | Knife coating | 1.8 | 200 | 84 | $9 \times 10^{-6}$ | NG |
| Comparative A2 | Solar cell with ITO film | Knife coating | 1.9 | 200 | 82 | $30 \times 10^{-6}$ | NG |
| Comparative A3 | Solar cell with ITO film | Knife coating | 1.7 | 200 | 83 | $10 \times 10^{-6}$ | NG |

TABLE 4-continued

|  | Base material | Coating method | Film thickness (μm) | Baking temperature (° C.) | Before testing weathering resistance | | Weathering resistance |
|---|---|---|---|---|---|---|---|
|  |  |  |  |  | Reflectance | Volume Resistivity (Ω · cm) |  |
| Comparative A4 | Solar cell with ITO film | Knife coating | 1.7 | 200 | 82 | $20 \times 10^{-6}$ | NG |
| Comparative A5 | Glass plate with ITO film | Knife coating | 1.5 | 200 | 72 | $8 \times 10^{-6}$ | NG |
| Comparative A6 | Glass plate with ITO film | Dispenser coating | 1.5 | 200 | 76 | $20 \times 10^{-6}$ | NG |
| Comparative A7 | Glass plate with ITO film | Dispenser coating | 1.5 | 200 | 73 | $10 \times 10^{-6}$ | NG |
| Comparative A8 | Glass plate with ITO film | Dispenser coating | 1.5 | 200 | 78 | $30 \times 10^{-6}$ | NG |
| Comparative A9 | Silicon substrate | Dispenser coating | 1.5 | 200 | 77 | $10 \times 10^{-6}$ | NG |
| Comparative A10 | Silicon substrate | Dispenser coating | 1.8 | 200 | 72 | $20 \times 10^{-6}$ | NG |
| Comparative A11 | Silicon substrate | Spray coating | 1.8 | 200 | 72 | $40 \times 10^{-6}$ | NG |
| Comparative A12 | Glass plate | Spray coating | 1.9 | 200 | 74 | $40 \times 10^{-6}$ | NG |
| Comparative A13 | Glass plate | Spray coating | 1.9 | 200 | 71 | $30 \times 10^{-6}$ | NG |
| Comparative A14 | Glass plate | Spray coating | 1.9 | 200 | 72 | $25 \times 10^{-6}$ | NG |
| Comparative A15 | Glass plate | Spray coating | 1.9 | 200 | 72 | $30 \times 10^{-6}$ | NG |

Table 3 and Table 4 obviously show the following. Although the electrodes of Comparative Example A1 and Comparative Example A3 showed well satisfactory primary properties such as a reflectance of 80% or more and a volume resistivity of less than $20 \times 10^{-6}$ Ω·cm directly after the baking, that is before the weathering test, the reflectance and the volume resistivity of electrodes are decreased (showed aged deterioration) to show unsatisfactory (NG) values after the weathering test. In the other Comparative Examples, one or both of the reflectance and the volume resistivity of the electrode was insufficient at a stage before the weathering test, and the reflectance and volume resistivity of the electrode were unsatisfactory after the weathering test. On the other hand, in the electrode of each of Examples, at stages before the weathering test and after the weathering test, the reflectance was 80% or more and the volume resistivity was less than $20 \times 10^{-6}$ Ω·cm. That is, the primary properties before the weathering test and the weathering resistance were sufficiently satisfactory.

Examples B1 to B32

Firstly, an aqueous solution of metallic salt was prepared by dissolving silver nitrate in deionized water. On the other hand, sodium citrate was dissolved in deionized water to obtain an aqueous solution of sodium citrate of 26% in concentration. In a gas flow of nitrogen at a temperature of 35° C., particulate ferrous sulfate was directly added and dissolved in the solution. Thus, an aqueous solution of a reducing agent containing citric ion and ferrous ion in a molar ratio of 3:2 was prepared. Next, while maintaining the temperature 35° C. of the above-described nitrogen gas flow, and while agitating the above-described aqueous solution of a reducing agent by rotating an agitator of magnetic stirrer at a rotation rate of 100 rpm, the above-described aqueous solution of metallic salt was dropped and mixed in the aqueous solution of reducing agent. Here, by controlling the concentration of each solutions such that the added amount of the aqueous solution of metallic salt was 1/10 or less the amount of the aqueous solution of a reducing agent, the reaction temperature was maintained at 40° C. even when the aqueous solution of a metallic salt at room temperature was dropped.

The mixing ratio of the above-described two aqueous solution was controlled such that an equivalent amount of the ferrous ion added as a reducing agent was three times of equivalent amount of the metallic ion. After ceasing dropping of the aqueous solution of a metallic salt, agitation of the mixed solution was continued for a further 15 minutes, thereby obtaining a fluid dispersion comprising colloidal metal (metal colloid). The fluid dispersion had a pH of 5.5, and stoichiometric amount of metal particles generated in the fluid dispersion was 5 g/litter. The thus obtained fluid dispersion was left at room temperature, and sedimented agglomerates of metal nanoparticles were separated by decantation.

Deionized water was added to the separated material to obtain a dispersed material. The dispersed material was subjected to desalting by ultrafiltration, and was subsequently subjected to replacement cleaning by methanol. Thus, content of metal (silver) was controlled to be 50 weight %. After that, coarse particles were separated by a centrifugal separator. By controlling the centrifugal force of the centrifugal separator, silver nanoparticles were controlled to include 71% in number average of silver nanoparticles having a primary grain size of 10 to 50 nm. That is, among the whole silver nanoparticles constituting 100%, the proportion of the silver nanoparticles having a primary grain size of 10 to 50 nm was controlled to be 71% in number average. The thus obtained silver nanoparticles were chemically modified by the protective agent having a main chain of organic molecule including a carbon backbone of carbon number of 3.

Next, the thus prepared silver nanoparticles of 10 parts by weight were dispersed in a mixed solution that contains water, ethanol and methanol. A composition for manufacturing an electrode was obtained by adding an additive in an amount of 1 part by weight to the fluid dispersion. The additive is shown in the Table 5 and Table 6 below. Next, the thus obtained composition was coated on a base material shown in Table 5 and Table 6 by a spin coater such that the coating had a thickness of 300 nm after the baking, and was subjected to baking for 20 minutes at 200° C. Thus, an electrode was formed on the base material. In the above-described process, the additive selected from metal oxide or metal hydroxide was added in a colloidal form having an average grain size of 1 to 100 nm mixed in water and ethanol.

Comparative Examples B1 to B5

Silver nanoparticles having an average grain size of 20 nm were prepared in accordance with the same manner as in Examples B1 to B32. The silver nanoparticles of 10 parts by weight were dispersed in a mixed solution that contained water, ethanol, and methanol. Without adding an additive to the fluid dispersion, the fluid dispersion was used as a composition for manufacturing an electrode. The thus obtained composition was coated on a base material shown in Table 6 by a spin coater such that the coating had a thickness of 300 nm after baking, and was subjected to baking for 20 minutes at 200° C. Thus an electrode was formed on the base material.

Comparative Test 2

Each of the electrode formed on the base material in Examples B1 to B32 and Comparative Examples B1 to B5 was subjected to an evaluation of electric conductivity and adhesion to the base material. The electric conductivity was determined as a volume resistivity (Ω·cm) calculated from a result of measurement by a four-probe method. Firstly, a thickness of the electrode after baking was directly measured from a cross section of the electrode using a SEM (Electron Microscope 5800: Hitachi, Ltd.). Next, the observed thickness of the electrode was inputted in a Four-Probe type Resistivity Meter (Loresta: Mitsubishi Chemical Corporation), and the volume resistivity of the electrode was measured. Adhesion of the electrode to the base material was evaluated qualitatively by stripping a bonding tape from the base material having the electrode formed thereon. "Good" denotes a case where only the bonding tape was stripped. "Moderate" denotes a case where the stripping of the bonding tape and local exposure of the base material surface were mixed. "NG" denotes a case where all the surface of the base material was exposed by stripping the bonding tape. The results are shown in Table 5 and Table 6.

TABLE 5

| | Base material | Additive | Volume Resistivity (Ω·cm) | Evaluation of adhesion |
| --- | --- | --- | --- | --- |
| Ex. B1 | Silicon | Silica | $20 \times 10^{-6}$ | Good |
| Ex. B2 | Silicon | Nickel acetate | $9 \times 10^{-6}$ | Moderate |
| Ex. B3 | Alumina | Alumina | $20 \times 10^{-6}$ | Good |
| Ex. B4 | Alumina | NiO | $19 \times 10^{-6}$ | Moderate |
| Ex. B5 | Alumina | ITO | $9 \times 10^{-6}$ | Moderate |
| Ex. B6 | Alumina | Tin acetate | $8 \times 10^{-6}$ | Moderate |
| Ex. B7 | ITO | Alumina | $20 \times 10^{-6}$ | Moderate |
| Ex. B8 | ITO | Silica | $20 \times 10^{-6}$ | Moderate |
| Ex. B9 | ITO | $Cr_2O_3$ | $19 \times 10^{-6}$ | Moderate |
| Ex. B10 | ITO | NiO | $19 \times 10^{-6}$ | Good |
| Ex. B11 | ITO | $Cu_2O_3$ | $18 \times 10^{-6}$ | Moderate |
| Ex. B12 | ITO | $Cu(OH)_2$ | $18 \times 10^{-6}$ | Moderate |
| Ex. B13 | ITO | ITO | $9 \times 10^{-6}$ | Good |
| Ex. B14 | ITO | ZnO | $9 \times 10^{-6}$ | Moderate |
| Ex. B15 | ITO | ATO | $9 \times 10^{-6}$ | Good |
| Ex. B16 | ITO | Nickel acetate | $9 \times 10^{-6}$ | Good |
| Ex. B17 | ITO | Copper citrate | $9 \times 10^{-6}$ | Moderate |
| Ex. B18 | ITO | Zinc acetilacetonate | $8 \times 10^{-6}$ | Good |
| Ex. B19 | ITO | Tin acetate | $8 \times 10^{-6}$ | Good |
| Ex. B20 | ITO | ATO + Tin acetate | $9 \times 10^{-6}$ | Good |
| Ex. B21 | ITO | Titanium isopropoxide | $20 \times 10^{-6}$ | Good |
| Ex. B22 | ITO | Side chain type polyether-modified silicone oil | $9 \times 10^{-6}$ | Moderate |

TABLE 6

| | Base material | Additive | Volume Resistivity (Ω·cm) | Evaluation of adhesion |
| --- | --- | --- | --- | --- |
| Ex. B23 | Glass | $Cr_2O_3$ | $19 \times 10^{-6}$ | Moderate |
| Ex. B24 | Glass | $Cu_2O$ | $18 \times 10^{-6}$ | Moderate |
| Ex. B25 | Glass | Cu(OH)2 | $18 \times 10^{-6}$ | Moderate |
| Ex. B26 | Glass | ATO | $9 \times 10^{-6}$ | Good |
| Ex. B27 | Glass | Zinc acetilacetonate | $8 \times 10^{-6}$ | Good |
| Ex. B28 | Glass | ATO + Tin aectate | $9 \times 10^{-6}$ | Good |
| Ex. B29 | Glass | Methyl silicate | $20 \times 10^{-6}$ | Good |
| Ex. B30 | Polyimide | ZnO | $9 \times 10^{-6}$ | Moderate |
| Ex. B31 | Polyimide | Copper citrate | $9 \times 10^{-6}$ | Moderate |
| Ex. B32 | Polyimide | Two end type amino-modified silicone oil | $10 \times 10^{-6}$ | Moderate |
| Comparative Ex. B1 | Silicon | Not added | $5 \times 10^{-6}$ | NG |
| Comparative Ex. B2 | Alumina | Not added | $5 \times 10^{-6}$ | NG |
| Comparative Ex. B3 | ITO | Not added | $5 \times 10^{-6}$ | NG |
| Comparative Ex. B4 | Glass | Not added | $5 \times 10^{-6}$ | NG |
| Comparative Ex. B5 | Polyimide | Not added | $5 \times 10^{-6}$ | NG |

From Table 5 and Table 6, the followings were obvious. Electric conductivity showed a value in the order of $10^{-6}$, in Comparative Examples B1 to B5 not containing metal oxide, metal hydroxide, or an organic metal compound as the additive. However, evaluation of adhesion each showed "NG" and the formed electrode was stripped by the bonding tape resulting in exposure of the surface of the base material. On the other hand, Examples B1 to B32 each showed excellent electric conductivity, and adhesion was evaluated as "Good" or "Moderate". As a result, it was ensured that adhesion of the electrode to the base material could be improved without deteriorating the electric conductivity by adding one or more additive selected from the group consisting of metal oxides, metal hydroxides, and organic metal compounds to the composition used in manufacturing the electrode.

Examples B33 to B57 and Comparative Examples B6 and B7

Firstly, each of metallic salts listed in Table 7 and Table 8 was dissolved in deionized water and aqueous solution of the metallic salt was prepared. On the other hand, sodium citrate was dissolved in deionized water to obtain an aqueous solution of sodium citrate of 26% in concentration. In a gas flow of nitrogen at a temperature of 35° C., particulate ferrous sulfate was directly added and dissolved in the solution. Thus, aqueous solution of reducing agent containing citric ion and ferrous ion in a molar ratio of 3:2 was prepared.

Next, an agitator of a magnetic stirrer was placed in the aqueous solution of reducing agent. While maintaining the temperature 35° C. of the above-described nitrogen gas flow, and while agitating the above-described aqueous solution of reducing agent by rotating the agitator of the magnetic stirrer at a rotation rate of 100 rpm, the above-described aqueous solution of metallic salt was dropped and mixed in the aqueous solution of reducing agent. Here, by controlling the concentration of each solutions such that the added amount of the aqueous solution of metallic salt was 1/10 or less of the amount of the aqueous solution of reducing agent, reaction temperature was maintained at 40° C. even when the aqueous solution of metallic salt at a room temperature was dropped. The mixing ratio of the above-described aqueous solution of reducing agent and the aqueous solution of metallic salt was controlled such that equivalent amount of the ferrous ion added as a reducing agent was three times of equivalent amount of the metallic ion. After ceasing dropping of the aqueous solution of metallic salt, agitation of the mixed solution was continued for further 15 minutes, thereby obtaining fluid dispersion comprising colloidal metal (metal colloid). The fluid dispersion had a pH of 5.5, and stoichiometric amount of the metal particles generated in the fluid dispersion was 5 g/litter.

The thus obtained fluid dispersion was left at a room temperature, and sedimented agglomerates of metal nanoparticles were separated by decantation. Deionized water was added to the separated material to obtain a dispersed material. The dispersed material was subjected to desalting by ultrafiltration, and was subsequently subjected to replacement cleaning by methanol. Thus, content of metal was controlled at 50 weight %. After that, coarse particles were separated by a centrifugal separator. By controlling the centrifugal force of the centrifugal separator, metal nanoparticles were controlled to include 71% in number average of metal nanoparticles having a primary grain size of 10 to 50 nm. That is, among the whole metal nanoparticles constituting 100%, proportion of the silver nanoparticles having a primary grain size of 10 to 50 nm was controlled to be 71% in number average. The thus obtained nanoparticles were chemically modified by the protective agent having a main chain of organic molecule comprising a carbon backbone of carbon number of 3.

Next, the thus prepared metal nanoparticles of 10 parts by weight were added and mixed in a mixed solution of 90 parts by weight to disperse the metal nanoparticles in the solution, where the mixed solution contained water, ethanol, and methanol. Further, the fluid dispersion was mixed with the additive shown in Table 7 and 8 in a proportion shown in Table 7 and Table 8. Thus, each of coating test compositions of Examples B33-B57 and Comparative Examples B6 and B7 was obtained. The metal nanoparticles constituting the coating test compositions of Examples B33-B57 include silver nanoparticles of 75 weight % or more.

Comparative Experiment 3

Next, each of the compositions for coating test obtained in Examples B33-B57 and Comparative Examples B6 and B7 was coated on a base material shown in Table 7 and Table 8 by various film-forming method such that the coating had a thickness of $10^2$ to $2 \times 10^3$ nm after the baking, and was subjected to baking under heat treatment conditions shown in Table 7 and Table 8. Thus an electric-conductive film was formed on a base material.

Each of the thus formed electric-conductive films were subjected to measurements of electric conductivity, reflectance, film thickness, and average surface roughness. Electric conductivity was evaluated in the same manner as in the above-described Comparative Test 2. Evaluation of the reflectance of the film was performed by the combination of UV-visible spectrophotometer and integrating sphere, and diffuse reflectance of 800 nm wavelength ray was measured. Thickness of the film was measured by observation of a cross section of the film using a SEM. Evaluation values with respect to the surface shape were obtained using an Atomic Force Microscope (AFM). By evaluating the values in accordance with JIS B0601, average surface roughness was determined.

TABLE 7

| | Metal nanoparticles | Additive | Film forming method | Base material | Heat treatment Temperature [° C.] | Time [min.] | Atmosphere |
|---|---|---|---|---|---|---|---|
| Ex. B33 | Ag 98 wt. % Au 1 wt. % | $Al_2O_3$ 1 wt. % | Knife coating | Glass | 200 | 60 | Air |
| Ex. B34 | Ag 98 wt. % Pt 1 wt. % | SiO2 1 wt. % | Slit coating | Glass | 200 | 60 | Air |
| Ex. B35 | Ag 98 wt. % Pd 1 wt. % | $TiO_2$ 1 wt. % | Spin coating | Polyimide | 220 | 20 | Air |
| Ex. B36 | Ag 98.9 wt. % Ru 0.1 wt. % | $Cr_2O_3$ 1 wt. % | inkjet coating | Polyimide | 320 | 20 | Air |
| Ex. B37 | Ag 98.9 wt. % Ni 0.1 wt. % | $MnO_2$ 1 wt. % | die coating | Polyimide | 320 | 20 | Air |
| Ex. B38 | Ag 99 wt. % | $Fe_2O_3$ 0.5 wt. % $Co_3O_4$ 0.5 wt. % | Spin coating | Polyimide | 320 | 20 | Air |
| Ex. B39 | Ag 90 wt. % | $Ag_2O$ 10 wt. % | Spin coating | PZT | 200 | 20 | Air |
| Ex. B40 | Ag 99 wt. % | $Cu(OH)_2$ 1 wt. % | Spin coating | Polyimide | 250 | 20 | Ar |
| Ex. B41 | Ag 98.9 wt. % Sn 0.1 wt. % | ZnO 1 wt. % | Spin coating | Polyimide | 320 | 20 | Air |
| Ex. B42 | Ag 98.9 wt. % In 0.1 wt. % | $MoO_2$ 1 wt. % | Spin coating | Polyimide | 320 | 20 | Air |
| Ex. B43 | Ag 98.9 wt. % Cr 0.1 wt. % | $SnO_2$ 1 wt. % | Spin coating | Polyimide | 320 | 20 | Air |
| Ex. B44 | Ag 98.9 wt. % Zn 0.1 wt. % | ITO 1 wt. % | Spin coating | Polyimide | 320 | 20 | Air |
| Ex. B45 | Ag 99 wt. % | ATO 1 wt. % | Spin coating | Polyimide | 320 | 20 | Air |
| Ex. B46 | Ag 99 wt. % | methyl silicate 1 wt. % | Dispenser coating | Polyimide | 320 | 20 | Air |
| Ex. B47 | Ag 99 wt. % | Titanium isopropoxide 1 wt. % | Off-set coating | Polyimide | 320 | 20 | Air |

TABLE 8

| | Metal nanoparticles | Additive | Film forming method | Base material | Heat treatment Temperature [° C.] | Time [min.] | Atmosphere |
|---|---|---|---|---|---|---|---|
| Ex. B48 | Ag 98 wt. % | Chromium acetate 1 wt. % | Spin coating | Polyimide | 320 | 20 | Air |
| Ex. B49 | Ag 99.5.% | Manganese formate 0.5 wt. % | Spin coating | Polyimide | 320 | 20 | Air |
| Ex. B50 | Ag 98.5 t. % Cu 1 wt. % | Iron citrate 0.5 wt. % | Spin coating | Polyimide | 320 | 20 | $N_2$ |
| Ex. B51 | Ag 99.4 wt. % Fe 0.1 wt. % | Cobalt formate 0.5 wt. % | Spin coating | Glass | 400 | 20 | Air |
| Ex. B52 | Ag 99.4.% Mn 0.1 wt. % | Nickel acetate 0.5 wt. % | Spin coating | Glass | 400 | 20 | Air |
| Ex. B53 | Ag 99 wt. % | Silver acetate 1 wt. % | Screen printing | Glass | 200 | 20 | Air |
| Ex. B54 | Ag 99 wt. % | Copper acetate 1 wt. % | Spray coating | Glass | 200 | 20 | $N_2$ |
| Ex. B55 | Ag 99 wt. % | Zinc acetate 1 wt. % | Spray coating | Glass | 200 | 20 | Air |
| Ex. B56 | Ag 99 wt. % | Molybdenum acetate 1 wt. % | Spray coating | Glass | 200 | 20 | Air |
| Ex. B57 | Ag 99 wt. % | Tin acetate 1 wt. % | Spray coating | Glass | 200 | 20 | Air |
| Comparative Ex. B6 | Ag 100 wt. % | Not added | Spray coating | Polyimide | 200 | 20 | Air |
| Comparative Ex. B7 | Ag 50 wt. % Pd 50 wt. % | Methyl silicate 1 wt. % | Dispenser coating | Polyimide | 320 | 20 | Air |

TABLE 9

| | Volume resistivity [$\Omega \cdot cm$] | Reflectance (800 nm) [% R] | Film thickness [nm] | Average surface roughness [nm] |
|---|---|---|---|---|
| Example B33 | $3.1 \times 10^{-6}$ | 91 | $2.0 \times 10^3$ | 50 |
| Example B34 | $3.5 \times 10^{-6}$ | 92 | $1.9 \times 10^3$ | 30 |
| Example B35 | $4.2 \times 10^{-6}$ | 93 | $1.0 \times 10^3$ | 50 |
| Example B36 | $5.1 \times 10^{-6}$ | 89 | $1.1 \times 10^3$ | 90 |
| Example B37 | $4.9 \times 10^{-6}$ | 88 | $1.0 \times 10^3$ | 80 |
| Example B38 | $5.2 \times 10^{-6}$ | 92 | $1.2 \times 10^3$ | 100 |
| Example B39 | $2.6 \times 10^{-6}$ | 98 | $1.2 \times 10^3$ | 10 |
| Example B40 | $2.8 \times 10^{-6}$ | 95 | $1.0 \times 10^3$ | 30 |
| Example B41 | $3.2 \times 10^{-6}$ | 93 | $1.0 \times 10^3$ | 20 |
| Example B42 | $4.2 \times 10^{-6}$ | 91 | $1.0 \times 10^3$ | 50 |
| Example B43 | $5.9 \times 10^{-6}$ | 89 | $1.0 \times 10^3$ | 70 |
| Example B44 | $4.8 \times 10^{-6}$ | 91 | $1.1 \times 10^3$ | 80 |
| Example B45 | $5.1 \times 10^{-6}$ | 92 | $1.0 \times 10^3$ | 70 |
| Example B46 | $5.5 \times 10^{-6}$ | 89 | $1.1 \times 10^3$ | 60 |
| Example B47 | $0.2 \times 10^{-6}$ | 87 | $1.0 \times 10^3$ | 60 |

TABLE 10

| | Volume resistivity [$\Omega \cdot cm$] | Reflectance (800 nm) [% R] | Film thickness [nm] | Average surface roughness [nm] |
|---|---|---|---|---|
| Example B48 | $5.3 \times 10^{-6}$ | 88 | $1.1 \times 10^3$ | 70 |
| Example B49 | $4.7 \times 10^{-6}$ | 88 | $1.0 \times 10^3$ | 70 |
| Example B50 | $3.2 \times 10^{-6}$ | 94 | $1.0 \times 10^3$ | 50 |
| Example B51 | $3.5 \times 10^{-6}$ | 91 | $1.2 \times 10^3$ | 30 |
| Example B52 | $4.1 \times 10^{-6}$ | 90 | $1.1 \times 10^3$ | 50 |
| Example B53 | $2.5 \times 10^{-6}$ | 96 | $1.0 \times 10^3$ | 30 |
| Example B54 | $3.5 \times 10^{-6}$ | 95 | $1.0 \times 10^3$ | 60 |
| Example B55 | $3.1 \times 10^{-6}$ | 93 | $1.0 \times 10^3$ | 50 |
| Example B56 | $3.2 \times 10^{-6}$ | 92 | $1.1 \times 10^3$ | 70 |
| Example B57 | $4.2 \times 10^{-6}$ | 93 | $1.0 \times 10^3$ | 50 |
| Comparative Example B6 | $2.5 \times 10^{-6}$ | 95 | $1.0 \times 10^2$ | 110 |
| Comparative Example B7 | $2.0 \times 10^{-6}$ | 80 | $1.1 \times 10^2$ | 50 |

As it is obvious from Table 9 and Table 10, where electric-conductive films formed using compositions of Examples B33 to B57 are compared with the electric-conductive film formed using a composition of Comparative Example B6, resistivity and reflectance were in the same level. However, with respect to the average surface roughness of the film, Comparative Example 6 showed a value of 110 nm, while Examples B33 to B57 showed values in the range of 10 to 100 nm ensuring the surface roughness appropriate for a texture of backside electrode constituting a substrate type solar cell. The electric-conductive film formed using the composition of Comparative Example B7 showed that volume resistivity increased and reflectance at 800 nm was reduced where the proportion of silver nanoparticles contained in the metal nanoparticles was less than 75 weight %.

Examples B58, B59 and Comparative Examples B8 and B9

The coating test composition used in Example B34 was coated through various methods on a base material shown in Table 11 described below such that the film thickness after baking was 100 nm in Example B58, 500 nm in Example B59, 50 nm in Comparative Example B8, and 70 nm in Comparative Example B9. After that, the coated base materials were subjected to baking under conditions described on Table 11. Thus, electric-conductive films were formed on the surfaces of the base materials.

In the same manner as in the Comparative Experiment 3, the thus formed electric-conductive films were subjected to measurements of resistivity, reflectance, film thickness, and average surface roughness. The results are shown in Table 12.

TABLE 11

| | Metal nanoparticles | Additive | Film forming method | Base material | Heat treatment Temperature [° C.] | Time [min.] | Atmosphere |
|---|---|---|---|---|---|---|---|
| Ex. B58 | Ag 98 wt. % | SiO$_2$ 1 wt. % | Spin coating | Glass | 200 | 60 | Air |
| Ex. B59 | Pt 1 wt. % | | | | | | |
| Comparative Ex. B8 | | | | | | | |
| Comparative Ex. B9 | | | | | | | |

TABLE 12

| | Volume resistivity [Ω · cm] | Reflectance (800 nm) [% R] | Film thickness [nm] | Average surface roughness [nm] |
|---|---|---|---|---|
| Example B58 | 3.9 × 10$^{-6}$ | 90 | 100 | 10 |
| Example B59 | 3.5 × 10$^{-6}$ | 92 | 500 | 10 |
| Comparative Example B8 | 8.1 × 10$^{-6}$ | 72 | 50 | 30 |
| Comparative Example B9 | 5.1 × 10$^{-6}$ | 80 | 70 | 20 |

The films were formed under the same conditions while varying the film thickness. As it is obvious from Table 12, where the film thickness was 100 nm or more as in Example B58 and B59, compared with Comparative Example B8 and Comparative Example B9 having a film thickness of less than 100 nm, reflectance and resistivity showed a substantially constant value of 90% or more in reflectance and 4×10$^{-6}$ Ω·cm or less in resistivity. Where the film thickness is less than 100 nm, it is considered that a continuous film cannot be formed by sintering, and a reduction of reflectance by partial transmission of incident light and/or increase of resistance caused by an insufficient point contacts between particles were generated.

Example B60, B61, and Comparative Example B10, B11

10 parts by weight of the metal nanoparticles shown in Table 13 was mixed and dispersed in 90 parts by weight of a mixed solution that contained water, ethanol, and methanol. Further, methyl silicate was added as an additive in the fluid dispersion such that 1 weight % of an additive was contained in the composition. Thus each of the coating test compositions of Examples B60, B61, and Comparative Examples B10, B11 was obtained.

Comparative Experiment 4

Each of the compositions obtained by Examples B60, B61, and Comparative Examples B 10, B 11 was coated using a dispenser coating method on a glass base material such that film thickness was in a range of 10$^2$ to 2×10$^3$ nm and the coated base material was baked in the air atmosphere for 20 minutes at 320° C. Thus an electric-conductive film was formed on each of the base materials.

The thus obtained electric-conductive films were subjected to evaluations of electric conductivity, resistivity, and adhesion. The electric conductivity and adhesion were evaluated in the same manner as in the Comparative Experiment 2, and the reflectance was evaluated in the same manner as in the Comparative Experiment 3. The results are shown in Table 14.

TABLE 13

| | Metal nanoparticles | Proportion of silver nanoparticles having an average grain size of 10 to 50 nm [number average %] | Carbon number of organic molecule main chain | Additive | Film forming method | Base material | Heat treatment Temperature [° C.] | Time [min.] | Atmosphere |
|---|---|---|---|---|---|---|---|---|---|
| Example 60 | Ag 99 wt. % | 71 | 1 | Methyl silicate 1 wt. % | Dispenser coating | Glass | 320 | 20 | Air |
| Example 61 | | 100 | 3 | | | | | | |
| Comparative Example B10 | | 71 | 10 | | | | | | |
| Comparative Example B11 | | 10 | 3 | | | | | | |

TABLE 14

| | Volume resistivity [Ω · cm] | Reflectance (800 nm) [% R] | Evaluation of adhesion |
|---|---|---|---|
| Example B60 | 4.0 × 10$^{-6}$ | 90 | Good |
| Example B61 | 4.0 × 10$^{-6}$ | 90 | Good |
| Comparative Example B11 | 1.0 × 10$^{-5}$ | 75 | Good |
| Comparative Example B12 | 8.0 × 10$^{-6}$ | 85 | Good |

As obviously shown in Table 14, where carbon number of carbon backbone of organic molecules chemically modifying the silver nanoparticles exceeded 3, the volume resistivity increased and the reflectance at 800 nm was reduced. Further, when the number average of silver nanoparticles having an average grain size of 10 to 50 nm was smaller than 70%, the volume resistivity increased and the reflectance at 800 nm was reduced.

Examples C1 to C35

Compositions for manufacturing an electrode were prepared by dispersing 10 parts by weight of metal nanoparticles shown in Table 15, Table 16, and Table 17 in a mixed solution that contained water, ethanol, and methanol. The metal nanoparticles had an average grain size of about 20 nm. In the compositions used in Examples C1 to C35, the proportion of silver nanoparticles in the metal nanoparticles is 100% where only the silver nanoparticles were used, and the proportion of silver nanoparticles in the metal nanoparticles was 95% where both the silver nanoparticles and nanoparticles of metal other than silver were used. Carbon number of carbon backbone of organic molecules chemically modifying the silver nanoparticles was 3. The metal nanoparticles contained 80% in number average of metal nanoparticles of a primary grain size in the range of 10 to 50 nm. Primer coating materials were prepared by dispersing 1 parts by weight of each of the components shown in Table 15, Table 16, and Table 17 in a mixed solution that contained water, ethanol, and methanol.

Base materials shown in Tables 15, 16, and 17 were prepared. Next, the primer coating material was coated on the base material in accordance with the coating method shown in Table 15, Table 16, and Table 17, and was dried in the air for 30 minutes at 60° C. Next, compositions for forming an electrode were coated through the method shown in Table 15, Table 16, and Table 17 on the base material coated with the primer coating material such that the thickness after the baking was 300 nm. After that, the coated base material was baked for 30 minutes at a temperature shown in Table 15, Table 16, and Table 17. Thus, an electrode was formed on the base material. In the Table 15, Table 16, and Table 17 below, spray C denotes a spray coating, dispenser C denotes a dispenser coating, inkjet C denotes an inkjet coating, spin C denotes a spin coating, die C denotes a die coating, knife C denotes a knife coating, and slit C denotes a slit coating respectively. The PET in Tables 16 and Table 17 denotes polyethylene-terephthalate.

Comparative Examples C1 to C5

Compositions for forming an electrode were prepared by dispersing 10 parts by weight of metal nanoparticles shown in Table 17 in a mixed solution of water, ethanol, and methanol. The metal nanoparticles had an average grain size of about 20 nm. In the compositions for forming an electrode of a solar cell used in Comparative Examples C1 to C5, the proportion of the silver nanoparticles contained in the metal nanoparticles was 100%. The carbon backbone of the organic molecules chemically modifying the metal nanoparticles had a carbon number of 3. In the metal nanoparticles, the proportion in number average of the metal nanoparticles having a primary grain size of 10 to 50 nm was 80% Further, base materials shown in Table 17 were prepared.

Next, without performing a primer treatment of the base material, a composition for manufacturing the electrode was coated through the method shown in Table 17 on the base material such that the film had a thickness of 300 nm. By baking the coated base material for 30 minutes at a temperature shown in Table 17, electrodes were formed on the base materials.

Comparative Experiment 5

Each of the electrode formed on the base material in Examples C1 to C35 and Comparative Examples C1 to C5 was subjected to an evaluation of electric conductivity and adhesion to the base material. The electric conductivity was determined as a volume resistivity ($\Omega \cdot cm$) calculated from the result of a measurement by a four-probe method. Firstly, the thickness of the electrode after the baking was directly measured from a cross section of the electrode using a SEM (Electron Microscope S800: Hitachi, Ltd.). Next, the observed thickness of the electrode was inputted in a Four-Probe type Resistivity Meter (Loresta: Mitsubishi Chemical Corporation), and the volume resistivity of the electrode was measured. Adhesion of the electrode to the base material was evaluated qualitatively by stripping a bonding tape from the base material having the electrode formed thereon. "Good" denotes a case where only the bonding tape was stripped. "Moderate" denotes a case where the stripping of the bonding tape and local exposure of the base material surface were mixed. "NG (Not Good)" denotes a case where all the surface of the base material was exposed by stripping the bonding tape. The results are shown in Table 18.

TABLE 15

| | | Primer treatment | | | Metal of nanoparticles | Electrode forming treatmemt | | |
|---|---|---|---|---|---|---|---|---|
| | Material contained in primer coating material | Coating method | Treating temperature [° C.] | Treating time [min.] | Base material | of composition for manufacnuring an electrode | Coating method | Baking temperature [° C.] | Baking time [min.] |
| Ex. C1 | $Ag_2O$ | Spray C | 60 | 30 | Silicon | Ag | Spray C | 300 | 30 |
| Ex. C2 | $Ag_2O$ | Dispenser C | 60 | 30 | Silicon | Ag | Dispenser C | 200 | 30 |
| Ex. C3 | $Ag_2O$ | Incjet C | 60 | 30 | Silicon | Ag | Inkjet C | 150 | 30 |
| Ex. C4 | $Ag_2O$ | Off-set printing | 60 | 30 | Silicon | Ag + Au | Off-set printing | 300 | 30 |
| Ex. C5 | CuO | Screen printing | 60 | 30 | Silicon | Ag + Cu | Screen printing | 300 | 30 |
| Ex. C6 | PdO | Spin C | 60 | 30 | Silicon | Ag + Pd | Spin C | 300 | 30 |
| Ex. C7 | NiO | Die C | 60 | 30 | Silicon | Ag + Ni | Die C | 300 | 30 |
| Ex. C8 | $MoO_2$ | Knife C | 60 | 30 | Silicon | Ag + Mo | Knife C | 300 | 30 |
| Ex. C9 | $Cr_2O_3$ | Slit C | 60 | 30 | Silicon | Ag + Cr | Slit C | 300 | 30 |
| Ex. C10 | $MnO_2$ | Spray C | 60 | 30 | Silicon | Ag + Mn | Spray C | 300 | 30 |
| Ex. C11 | $Al_2O_3$ | Dispenser C | 60 | 30 | Silicon | Ag + Al | Dispenser C | 300 | 30 |
| Ex. C12 | ZrO | Inkjet C | 60 | 30 | Silicon | Ag + Zr | Inkjet C | 300 | 30 |
| Ex. C13 | $SiO_2$ | Off-set printing | 60 | 30 | Silicon | Ag + Mn | Off-set printing | 300 | 30 |
| Ex. C14 | $SiO_2$ | Screen printing | 60 | 30 | ITO | Ag, Sn alloy | Screen printing | 300 | 30 |
| Ex. C15 | $In_2O_3$ | Spin C | 60 | 30 | ITO | Ag, Sn alloy | Spin C | 300 | 30 |

TABLE 15-continued

| | | Primer treatment | | | | Metal of nanoparticles of composition for manufacturing an electrode | Electrode forming treatment | | |
|---|---|---|---|---|---|---|---|---|---|
| | Material contained in primer coating material | Coating method | Treating temperature [° C.] | Treating time [min.] | Base material | | Coating method | Baking temperature [° C.] | Baking time [min.] |
| Ex. C16 | ZnO | Die C | 60 | 30 | IZO | Ag + Zn | Die C | 300 | 30 |
| Ex. C17 | SiO$_2$ | Knife C | 60 | 30 | Glass | Ag | Knife C | 300 | 30 |
| Ex. C18 | TiO$_2$ | Slit C | 60 | 30 | Polyimide | Ag + Ti | Slit C | 200 | 30 |

TABLE 16

| | | Primer treatment | | | | Metal of nanoparticles of composition for forming an electrode | Electrode forming treatment | | |
|---|---|---|---|---|---|---|---|---|---|
| | Material contained in primer coating material | Coating method | Treating temperature [° C.] | Treating time [min.] | Base material | | Coating method | Baking temperature [° C.] | Baking time [min.] |
| Ex. C19 | Acryl | Spray C | 60 | 30 | Silicon | Ag + Al | Spray C | 150 | 30 |
| Ex. C20 | Vinyl acetate | Dispenser C | 60 | 30 | ITO | Ag + Pt | Dispenser C | 150 | 30 |
| Ex. C21 | Epoxy | Incjet C | 60 | 30 | Polyimide | Ag + Ru | Inkjet C | 150 | 30 |
| Ex. C22 | Polyester | Off-set printing | 60 | 30 | PET | Ag + Sn | Off-set printing | 150 | 30 |
| Ex. C23 | Polyester | Screen printing | 60 | 30 | Alumina | Ag | Screen printing | 150 | 30 |
| Ex. C24 | Polyurethane | Spin C | 60 | 30 | Glass | Ag | Spin C | 300 | 30 |
| Ex. C25 | Polyvinyl pyrrolidone | Die C | 60 | 30 | Polyimide | Ag | Die C | 150 | 30 |
| Ex. C26 | Ethyl celurose | Knife C | 60 | 30 | PET | Ag | Knife C | 150 | 30 |
| Ex. C27 | Tetra-ethoxysilne | Slit C | 60 | 30 | Silicon | Ag | Slit C | 200 | 30 |
| Ex. C28 | Titanium isoprpoxide | Spray C | 60 | 30 | ITO | Ag + Sn | Spray C | 200 | 30 |
| Ex. C29 | Calcium stearete | Dispenser C | 60 | 30 | Polyimide | Ag | Dispenser C | 150 | 30 |
| Ex. C30 | 3-mercaptopropylmethyl-dimethoxysilane | Inkjet C | 60 | 30 | Silicon | Ag | Inkjet C | 200 | 30 |

TABLE 17

| | | Primer treatment | | | | Metal of nanoparticles of composition for forming an electrode | Electrode forming treatment | | |
|---|---|---|---|---|---|---|---|---|---|
| | Material contained in primer coating material | Coating method | Treating temperature [° C.] | Treating time [min.] | Base material | | Coating method | Baking temperature [° C.] | Baking time [min.] |
| Ex. C31 | Triethanolamintitanate copolymer that includes components of 2,4-tolylene diisocyanate, polycaprolactone, and polyethylene glycol in a molar ratio of 20:50:1. | Spin C | 60 | 30 | ITO | Ag + In | Spin C | 200 | 30 |
| Ex. C32 | | Spin C | 60 | 30 | ITO | Ag | Spin C | 200 | 30 |
| Ex. C33 | | Spin C | 60 | 30 | Polyimide | Ag | Spin C | 200 | 30 |
| Ex. C34 | | Spray C | 60 | 30 | PET | Ag | Spray C | 200 | 30 |
| Ex. C35 | | Spin C | 60 | 30 | Glass | Ag | Spin C | 200 | 30 |
| Comparative Ex. 1 | — | — | — | — | Silicon | Ag | Spin C | 300 | 30 |
| Comparative Ex. 2 | — | — | — | — | Silicon | Ag | Screen Printing | 200 | 30 |
| Comparative Ex. 3 | — | — | — | — | Silicon | Ag | Die C | 150 | 30 |
| Comparative Ex. 4 | — | — | — | — | ITO | Ag | Inkjet C | 300 | 30 |
| Comparative Ex. 5 | — | — | — | — | Polyimide | Ag | Spray C | 150 | 30 |

TABLE 18

| | Volume resistivity [Ω·cm] | Evaluation of adhesion |
|---|---|---|
| Ex. C1 | 3.3 × 10$^{-6}$ | Good |
| Ex. C2 | 5.0 × 10$^{-6}$ | Good |
| Ex. C3 | 6.1 × 10$^{-6}$ | Moderate |
| Ex. C4 | 4.5 × 10$^{-6}$ | Good |
| Ex. C5 | 5.5 × 10$^{-6}$ | Good |
| Ex. C6 | 6.2 × 10$^{-6}$ | Good |
| Ex. C7 | 4.3 × 10$^{-6}$ | Good |
| Ex. C8 | 6.2 × 10$^{-6}$ | Moderate |
| Ex. C9 | 5.5 × 10$^{-6}$ | Good |
| Ex. C10 | 6.2 × 10$^{-6}$ | Moderate |
| Ex. C11 | 7.5 × 10$^{-6}$ | Good |
| Ex. C12 | 6.2 × 10$^{-6}$ | Moderate |

TABLE 18-continued

| | Volume resistivity [Ω · cm] | Evaluation of adhesion |
|---|---|---|
| Ex. C13 | $8.3 \times 10^{-6}$ | Moderate |
| Ex. C14 | $4.6 \times 10^{-6}$ | Good |
| Ex. C15 | $5.2 \times 10^{-6}$ | Moderate |
| Ex. C16 | $6.2 \times 10^{-6}$ | Moderate |
| Ex. C17 | $4.1 \times 10^{-6}$ | Moderate |
| Ex. C18 | $5.8 \times 10^{-6}$ | Moderate |
| Ex. C19 | $7.2 \times 10^{-6}$ | Good |
| Ex. C20 | $7.5 \times 10^{-6}$ | Moderate |
| Ex. C21 | $7.6 \times 10^{-6}$ | Good |
| Ex. C22 | $6.3 \times 10^{-6}$ | Moderate |
| Ex. C23 | $7.2 \times 10^{-6}$ | Moderate |
| Ex. C24 | $3.2 \times 10^{-6}$ | Good |
| Ex. C25 | $6.4 \times 10^{-6}$ | Moderate |
| Ex. C26 | $5.7 \times 10^{-6}$ | Moderate |
| Ex. C27 | $4.9 \times 10^{-6}$ | Good |
| Ex. C28 | $5.2 \times 10^{-6}$ | Moderate |
| Ex. C29 | $5.2 \times 10^{-6}$ | Moderate |
| Ex. C30 | $4.9 \times 10^{-6}$ | Good |
| Ex. C31 | $5.1 \times 10^{-6}$ | Moderate |
| Ex. C32 | $3.1 \times 10^{-6}$ | Good |
| Ex. C33 | $3.1 \times 10^{-6}$ | Good |
| Ex. C34 | $3.1 \times 10^{-6}$ | Good |
| Ex. C35 | $3.1 \times 10^{-6}$ | Good |
| Comparative Example C1 | $3.7 \times 10^{-6}$ | NG |
| Comparative Example C2 | $5.0 \times 10^{-6}$ | NG |
| Comparative Example C3 | $7.8 \times 10^{-6}$ | NG |
| Comparative Example C4 | $4.4 \times 10^{-6}$ | NG |
| Comparative Example C5 | $7.7 \times 10^{-6}$ | NG |

From Table 18, the followings were obvious. In Comparative Examples C1 to C5 which were not subjected to a primer treatment, electric conductivity showed a value in the order of $10^{-6}$. However, evaluation of adhesion each showed "NG" and the formed electrode was stripped by the bonding tape, resulting in exposure of the surface of the base material. On the other hand, Examples C1 to C35 each had excellent electric conductivity, and showed adhesion evaluated as "Good" or "Moderate". As a result, it was ensured that adhesion of the electrode to the base material could be improved without deteriorating the electric conductivity by performing the primer treatment.

Examples C36 to C41

Compositions for forming an electrode were prepared by dispersing 10 parts by weight of metal nanoparticles shown in Table 19 in a mixed solution that contained water, ethanol, and methanol. The metal nanoparticles had an average grain size of about 20 nm. Primer coating materials were prepared by dispersing 1 parts by weight of each of the components shown in Table 19 in a mixed solution that contained water, ethanol, and methanol. ITOs were prepared as base materials.

Next, the primer coating material was coated on the base material using a spin-coating method, and was dried in the air for 30 minutes at 60° C. Next, the composition for manufacturing an electrode was coated using a spin coating method through the method shown in Table 15, Table 16, and Table 17 on the base material coated with the primer coating material such that the thickness after the baking was 300 nm. After that, by baking the coated base material for 30 minutes at 200° C., an electrode was formed on the base material.

TABLE 19

| | | Composition for manufacturing an electrode | | | | | | |
|---|---|---|---|---|---|---|---|---|
| | | Primer treatment | | | | | Electrode forming treatment | |
| | Material contained in primer coating material | Treating temperature [° C.] | Treating time [min.] | Base material | Species of metal nanoparticles | Proportion of silver nanoparticles having an average grain size of 10 to 50 nm [Number average] | Carbon number of organic molecule main chain | Baking temperature [° C.] | Baking time [min.] |
| Ex. C36 | copolymer that includes components of | 60 | 30 | ITO | Ag: 75 Pd: 25 | 80 | 3 | 200 | 30 |
| Ex. C37 | 2,4-tolylene diisocyanate, polycaprolactone, and | | | | Ag: 100 | 80 | 1 | | |
| Ex. C38 | polyethylene glycol in a molar ratio of 20:50:1. | | | | Ag: 100 | 100 | 3 | | |
| Ex. C39 | copolymer that includes components of | 60 | 30 | ITO | Ag: 50 Pd: 50 | 80 | 3 | 200 | 30 |
| Ex. C40 | 2,4-tolylene diisocyanate, | | | | Ag: 100 | 80 | 4 | | |
| Ex. C41 | polycaprolactone, and polyethylene glycol in a molar ratio of 20:50:1. | | | | Ag: 100 | 10 | 3 | | |

Comparative Experiment 6

The base materials coated with the electrodes obtained in Examples C36 to C41 were subjected to evaluations of electric conductivity, resistivity, and adhesion of the electrode to the base material. The electric conductivity and adhesion to the base material were evaluated in the same manner as in the Comparative Experiment 5, and evaluation of the reflectance was performed by the combination of UV-visible spectrophotometer and integrating sphere, and the reflectance of the film at a wavelength of 800 nm was measured. The results are shown in Table 20.

TABLE 20

| | Volume resistivity [Ω·cm] | Reflectance (800 nm) [% R] | Evaluation of adhesion |
|---|---|---|---|
| Ex. C36 | $6.2 \times 10^{-6}$ | 92 | Good |
| Ex. C37 | $2.8 \times 10^{-6}$ | 95 | Good |
| Ex. C38 | $2.7 \times 10^{-6}$ | 95 | Good |
| Ex. C39 | $5.0 \times 10^{-5}$ | 80 | Good |
| Ex. C40 | $5.0 \times 10^{-5}$ | 75 | Good |
| Ex. C41 | $1.0 \times 10^{-5}$ | 80 | Good |

As obviously shown in Table 20, when the number average of silver nanoparticles having an average grain size of 10 to 50 nm was smaller than 75%, the volume resistivity increased and the reflectance at 800 nm was reduced. Further, when carbon number of carbon backbone of organic molecules chemically modifying the silver nanoparticles exceeded 3, the volume resistivity increased and the reflectance at 800 nm was reduced. Further, when the number average of silver nanoparticles having an average grain size of 10 to 50 nm was smaller than 70%, the volume resistivity increased and the reflectance at 800 nm was reduced.

INDUSTRIAL APPLICABILITY

In accordance with the composition of the present invention, it is possible to obtain an electrode which is mainly composed of silver and substantially organic material free. Therefore, even when a solar cell formed with the electrode is used for long ages, the electro-conductivity and the reflectance can be maintained at a high state. Therefore, it is possible to obtain an electrode having excellent secular stability.

In the method of manufacturing an electrode of a solar cell according to the present invention, it is possible to produce an electrode by a simple process including forming a film by wet-coating the composition on a base material, and baking the base material coated with the composition. Since a vacuum process is not required in the film formation, there is little constraint on the process. Further, in accordance with the present invention, it is possible to form an electrode by a low temperature baking at 400° C. or less. Therefore, it is possible to reduce an energy consumed during the formation process of the electrode.

Therefore, the present invention can provide an electrode having an excellent secular stability that enables the long age use of the solar cell. In addition, it is possible to largely reduce the running cost of a production appliance of the electrode.

The invention claimed is:

1. A method of manufacturing an electrode, comprising the step of:
   forming an electrode by coating a composition for manufacturing an electrode on a base material using a wet-coating method, wherein
   the composition comprises metal nanoparticles dispersed in a dispersive medium,
   a content of the metal nanoparticles is 2.5 to 95.0 weight %,
   75 weight % or more of the metal nanoparticles is constituted of nanoparticles consisting of silver,
   the metal nanoparticles being chemically modified by a protective agent having an organic molecular main chain comprising a carbon backbone of carbon number of 1 to 3, and
   the number of the metal nanoparticles having a primary grain size of 10 to 50 nm is 70% or more of the total number of the metal nanoparticles contained in the composition.

2. The method of manufacturing an electrode according to claim 1, wherein the base material is a substrate made of any one selected from silicon, glass, ceramics including transparent electric-conductive material, macromolecule material, and a metal; or the base material is a layered body of two or more materials selected from the group consisting of silicon, glass, ceramics including transparent electric-conductive material, macromolecule materials, and metals.

3. The method of manufacturing an electrode according to claim 1, wherein the base material is a solar cell element, or a solar cell element equipped with a transparent electrode.

4. The method of manufacturing an electrode according to claim 1, wherein the wet coating method is selected from any of a spray-coating method, a dispenser-coating method, a spin-coating method, a knife-coating method, a slit-coating method, an inkjet-coating method, a screen-printing method, a off-set printing method, and a die-coating method.

* * * * *